United States Patent
Tsukada et al.

(10) Patent No.: US 11,006,529 B2
(45) Date of Patent: May 11, 2021

(54) CIRCUIT FORMING METHOD

(71) Applicant: FUJI CORPORATION, Chiryu (JP)

(72) Inventors: Kenji Tsukada, Toyota (JP); Masatoshi Fujita, Anjyo (JP); Yoshitaka Hashimoto, Kariya (JP); Tasuku Takeuchi, Kariya (JP); Akihiro Kawajiri, Chiryu (JP); Masato Suzuki, Miyoshi (JP); Katsuaki Makihara, Gamagori (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/307,082

(22) PCT Filed: Jun. 28, 2016

(86) PCT No.: PCT/JP2016/069079
§ 371 (c)(1),
(2) Date: Dec. 4, 2018

(87) PCT Pub. No.: WO2018/003000
PCT Pub. Date: Jan. 4, 2018

(65) Prior Publication Data
US 2019/0150292 A1    May 16, 2019

(51) Int. Cl.
*H05K 3/12* (2006.01)
*H05K 1/09* (2006.01)
*H05K 3/46* (2006.01)

(52) U.S. Cl.
CPC .......... *H05K 3/1283* (2013.01); *H05K 1/097* (2013.01); *H05K 3/125* (2013.01); *H05K 3/4664* (2013.01);
(Continued)

(58) Field of Classification Search
CPC .... H05K 3/1283; H05K 3/125; H05K 3/4464; H05K 1/097; H05K 2203/107;
(Continued)

(56) References Cited

U.S. PATENT DOCUMENTS

| | | | |
|---|---|---|---|
| 2003/0085057 A1 | 5/2003 | Hashimoto | |
| 2006/0065955 A1* | 3/2006 | Sakurada | H05K 3/4647 257/659 |

(Continued)

FOREIGN PATENT DOCUMENTS

| | | |
|---|---|---|
| CN | 1777349 A | 5/2006 |
| EP | 1 926 357 A2 | 5/2008 |

(Continued)

OTHER PUBLICATIONS

International Search Report dated Sep. 13, 2016 in PCT/JP2016/069079 filed Jun. 28, 2016.

*Primary Examiner* — Gordon Baldwin
*Assistant Examiner* — Christina D McClure
(74) *Attorney, Agent, or Firm* — Oblon, McClelland, Maier & Neustadt, L.L.P.

(57) ABSTRACT

A circuit forming method where a metal ink is ejected to a planned formation position of a first wiring at an upper face of a base material. Then, the metal ink is baked, and first wiring is formed. Further, a planned connection section of the first wiring and a second wiring is unbaked. The metal-ink is ejected over an upper face of the unbaked metal ink and a planned formation position of the second wiring at the upper face of the base material. Since the wettability of the upper face of the unbaked metal ink and the wettability of the upper face of the base material are equal to each other, the ejected metal ink ejected and the unbaked metal ink are (Continued)

not separated from each other, so that it is possible to properly connect the first wiring and the second wiring to each other.

5 Claims, 24 Drawing Sheets

(52) U.S. Cl.
CPC .................. *H05K 2203/107* (2013.01); *H05K 2203/1131* (2013.01); *H05K 2203/1173* (2013.01); *H05K 2203/1476* (2013.01)

(58) Field of Classification Search
CPC ... H05K 2203/1131; H05K 2203/1173; H05K 2203/1476
See application file for complete search history.

(56) References Cited

U.S. PATENT DOCUMENTS

| | | | | |
|---|---|---|---|---|
| 2007/0105395 | A1* | 5/2007 | Kinzel | H05K 3/02 |
| | | | | 438/758 |
| 2010/0035375 | A1* | 2/2010 | Grigoropoulos | H05K 1/162 |
| | | | | 438/99 |
| 2012/0251735 | A1* | 10/2012 | Schuster | H05K 3/125 |
| | | | | 427/555 |
| 2016/0034062 | A1 | 2/2016 | Xue | |

FOREIGN PATENT DOCUMENTS

| | | |
|---|---|---|
| JP | 2011-198923 A | 10/2011 |
| JP | 2012-227387 A | 11/2012 |

\* cited by examiner

CIRCUIT FORMING METHOD

TECHNICAL FIELD

The present applications relates to a circuit forming method of forming a circuit by using an ejecting device that ejects a metal-containing liquid containing metal particles.

BACKGROUND ART

In recent years, as described in the patent literature below, a technology has been developed that forms a circuit by using an ejecting device that ejects a metal-containing liquid containing metal particles. Specifically, for example, a metal-containing liquid is ejected in the form of a line in accordance with a circuit pattern by the ejecting device. Then, by baking the metal-containing liquid with, for example, a laser, the metal-containing liquid becomes a wiring, and a circuit is formed.

PTL 1: Japanese Unexamined Patent Application Publication No. 2011-198923

BRIEF SUMMARY

Technical Problem

When multiple wirings are to be connected by using the technology that is described in the aforementioned patent literature, for example, after forming a rust wiring on a base material, a metal-containing liquid is ejected to a planned formation position of a second wiring so as to cross the first wiring. That is, the metal-containing liquid is ejected over an upper face of the first wiring and the planned formation position of the second wiring at an upper face of the base material. However, since the wettability of the upper face of the wiring and the wettability of the upper face of the base material differ from each other, the metal-containing liquid ejected onto the upper face of the wiring and the metal-containing liquid ejected onto the upper face of the base material may be separated from each other. When the metal-containing liquids separated in this way are baked, a broken wiring, that is, the second wiring that is not connected to the first wiring is formed, which is not desirable. The present disclosure takes account of such circumstances, and an object thereof is to form a circuit in which a first wiring and a second wiring are properly connected to each other.

Solution to Problem

To solve the problems above, a circuit forming method of the present disclosure is a circuit forming method of, by using an ejecting device configured to eject a metal-containing liquid containing metal particles, forming a circuit including a first wiring and a second wiring that is connected to the first wiring; and comprises a first ejection step of ejecting a metal-containing liquid to a planned formation position of the first wiring, a first baking step of forming the first wiring by baking the metal-containing liquid ejected in the first ejection step, the baking being performed so as to exclude a planned connection section of the first wiring and the second wiring, a second ejection step of ejecting a metal-containing liquid to a planned formation position of the second wiring including the planned connection section, and a second baking step of forming the second wiring connected to the first wiring by baking the metal-containing liquid ejected in the second ejection step.

A circuit forming method of the present disclosure is a circuit forming method of, by using an ejecting device configured to eject a metal-containing liquid containing metal particles, forming a circuit including a first wiring and a second wiring that is connected to the first wiring; and comprises a first ejection step of ejecting a metal-containing liquid to a planned formation position of the first wiring, a third baking step of forming the first wiring by baking the metal-containing liquid ejected in the first ejection step, a third ejection step of ejecting a metal-containing liquid to a planned connection section of the first wiring and the second wiring, a fourth ejection step of ejecting a metal-containing liquid to a planned formation position of the second wiring including the metal-containing liquid ejected in the third ejection step, and a fourth baking step of forming the second wiring connected to the first wiring by baking the metal-containing liquid ejected in the fourth ejection step.

A circuit forming method of the present disclosure is a circuit forming method of, by using an ejecting device configured to eject a metal-containing liquid containing metal particles, forming a circuit including a first wiring and a second wiring that is connected to the first wiring; and comprises a first ejection step of ejecting a metal-containing liquid to a planned formation position of the first wiring, a third baking step of forming the first wiring by baking the metal-containing liquid ejected in the first ejection step, a fifth ejection step of ejecting a metal-containing liquid to a planned formation position of the second wiring with a clearance from a planned connection section of the first wiring and the second wiring, the clearance being shorter than a diameter of a droplet ejected by the ejecting device, a fifth baking step of forming the second wiring with the clearance front the first wiring by baking the metal-containing liquid ejected in the fifth ejection step, a sixth ejection step of ejecting a metal-containing liquid into the clearance so as to exist at a portion extending over the first wiring and the second wiring, and a sixth baking step of connecting the first wiring and the second wiring to each other by baking the metal-containing liquid ejected in the sixth ejection step.

A circuit forming method of the present disclosure is a circuit forming method of, by using an ejecting device configured to eject a metal-containing liquid containing metal particles, forming a circuit including a first wiring, a second wiring that is connected to the first wiring, and a third wiring that is connected to one of the first wiring and the second wiring; and comprises a first ejection step of ejecting a metal-containing liquid to a planned formation position of the first wiring, a third baking step of forming the first wiring by baking the metal-containing liquid ejected in the first ejection step, a fifth ejection step of ejecting a metal-containing liquid to a planned formation position of the second wiring with a clearance from a planned connection section of the first wiring and the second wiring, the clearance being shorter than a diameter of a droplet ejected by the ejecting device, a fifth baking step of forming the second wiring with the clearance from the first wiring by baking the metal-containing liquid ejected in the fifth ejection step, a seventh ejection step of ejecting a metal-containing liquid to a planned formation position of the third wiring with a clearance from a planned connection section of the one of the first wiring and the second wiring and the third wiring, the clearance being shorter than a diameter of a droplet ejected by the ejecting device, a seventh baking step of forming the third wiring with the clearance from the one of the first wiring and the second wiring by baking the metal-containing liquid ejected in the seventh ejection step, an eighth ejection step of ejecting a metal-containing liquid into the clearance so as to exist at a portion extending over the first wiring and the second wiring, and ejecting a metal-containing liquid into the clearance so as to exist at a portion extending over the one of the first wiring and the second wiring and the third wiring, and an eighth baking step of, by baking the metal-containing liquids ejected in the eighth ejection step, connecting the first wiring and the second wiring to each other and connecting the one of the first wiring and the second wiring and the third wiring to each other.

Advantageous Effects

In the circuit forming method of the present disclosure, with the planned connection section of the first wiring being unbaked, a metal-containing liquid is ejected onto a portion extending over the unbaked planned connection section and the planned formation position of the second wiring. That is, the metal-containing liquid is ejected over the upper face of the unbaked first wiring and the planned formation position of the second wiring at the upper face of the base material. Since the wettability of the upper face of the unbaked first wiring and the wettability of the upper face of the base material are equal to each other, the metal-containing liquid ejected onto the upper face of the unbaked wiring and the metal-containing liquid ejected onto the upper face of the base material are not separated from each other, so that it is possible to properly connect the first wiring and the second wiring to each other.

In the circuit forming method of the present disclosure, after forming the first wiring, a metal-containing liquid is ejected onto the planned connection section of the first wiring. In addition, onto a portion extending over the metal-containing liquid and the planned formation position of the second wiring, a metal-containing liquid is ejected. Since the wettability of the upper face of the ejected metal-containing liquid and the wettability of the upper face of the base material are equal to each other, the metal-containing liquid ejected onto the upper face of the metal-containing liquid and the metal-containing liquid ejected onto the upper face of the base material are not separated from each other, so that it is possible to properly connect the first wiring and the second wiring to each other.

In the circuit forming method of the present disclosure, after forming the first wiring and the second wiring with a predetermined clearance therebetween, a metal-containing liquid is ejected into the clearance so as to exist at a portion extending over the first wiring and the second wiring. Note that the clearance is smaller than the diameter of droplets of the metal-containing liquid that is ejected by the ejecting device. Therefore, the droplets of the metal-containing liquid ejected into the clearance exist at the portion extending over the first wiring and the second wiring. Since the droplets of the metal-containing liquid existing at the portion extending over the first wiring and the second wiring are pulled towards both the first wiring and the second wiring, the droplets do not flow towards the first wiring and the second wiring. This maintains the first wiring and the second wiring in a connected state by the droplets of the metal-containing liquid, so that it is possible to properly connect the first wiring and the second wiring to each other.

In the circuit forming method of the present disclosure, after forming the first wiring, the second wiring, and the third wiring together with predetermined clearances therebetween, metal-containing liquids are ejected together into the respective clearances together, and the metal-containing liquids ejected into the respective clearances are baked together. Note that the clearance is smaller than the diameter of droplets of the metal-containing liquid that is ejected by the ejecting device. By this, in each clearance, the droplets of the metal-containing liquid exist at a portion extending over two wirings, so that it is possible to properly connect each wiring. In the circuit forming method, the step of forming wirings with clearances therebetween, the step of ejecting metal-containing liquids into the clearances between the wirings, and the step of baking the metal-containing liquids are performed together. This makes it possible to aim at increasing throughput by efficiently performing each step.

DESCRIPTION OF EMBODIMENTS

Configuration of Circuit Forming Device

Figure 1:
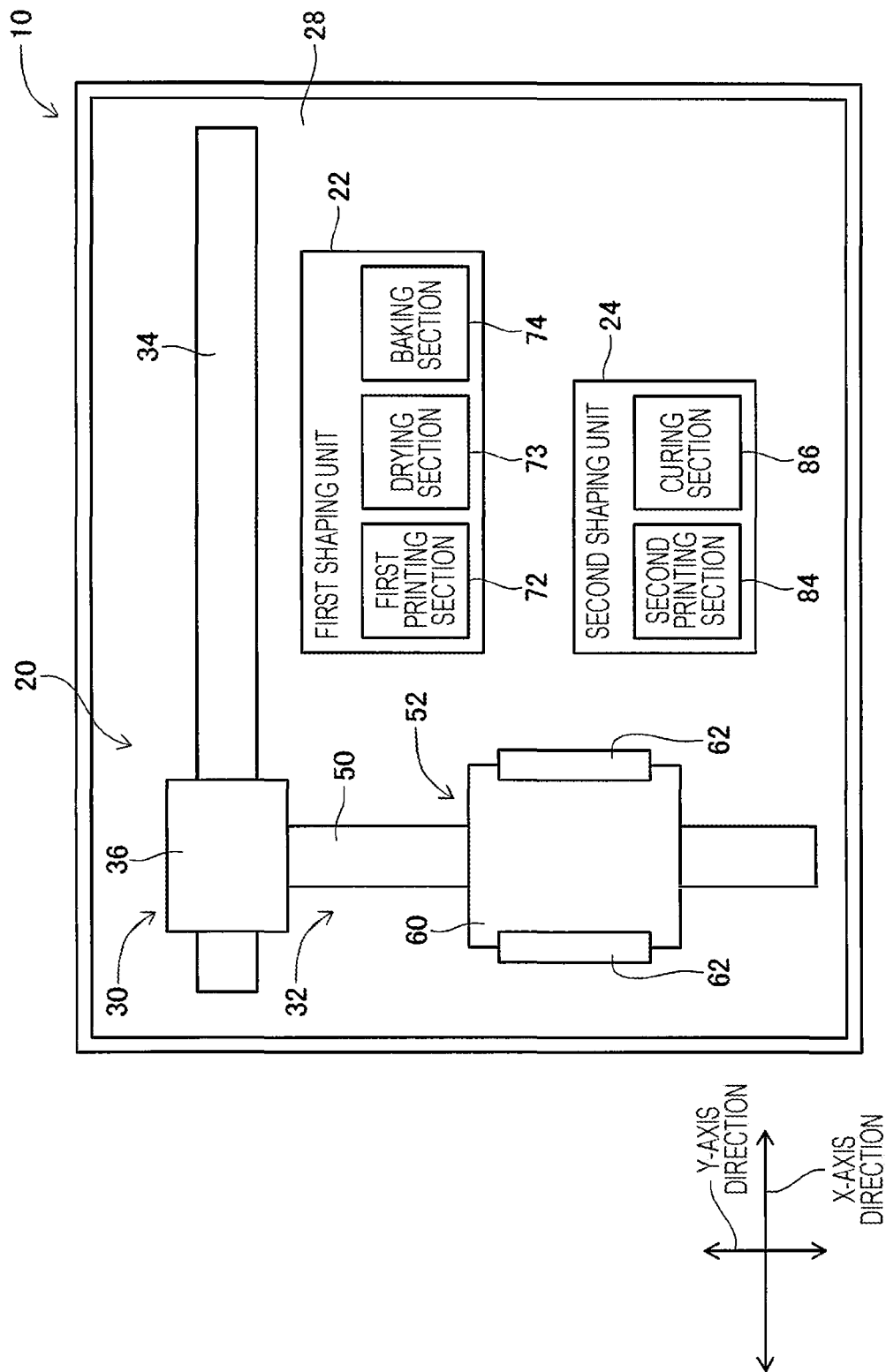
FIG. 1 illustrates a circuit forming device.

FIG. 1 illustrates circuit forming device 10. Circuit forming device 10 is provided with conveyance device 20, first shaping unit 22, second shaping unit 24, and control device (see FIG. 2) 26. Conveyance device 20, first shaping unit 22, and second shaping unit 24 are disposed on base 28 of circuit forming device 10. Base 28 generally has a rectangular shape; and, in the description below, the longitudinal direction of base 28 is called an X-axis direction, the lateral direction of base 28 is called a Y-axis direction, and a direction orthogonal to both the X-axis direction and the Y-axis direction is called a Z-axis direction, and the description is given.

Conveyance device 20 is provided with X-axis slide mechanism 30 and Y-axis slide mechanism 32. X-axis slide mechanism 30 includes X-axis slide rail 34 and X-axis slider 36. X-axis slide rail 34 is disposed on base 28 so as to extend in the X-axis direction. X-axis slider 36 is held by X-axis slide rail 34 so as to be slidable in the X-axis direction. Further, X-axis slide mechanism 30 includes electromagnetic motor (see FIG. 2) 38, and X-axis slider 36 moves to any position in the X-axis direction by driving electromagnetic motor 38. Y-axis slide mechanism 32 includes Y-axis slide rail 50 and stage 52. Y-axis slide rail 50 is disposed on base 28 so as to extend in the Y-axis direction, and is movable in the X-axis direction. One end portion of Y-axis slide rail 50 is connected to X-axis slider 36. Stage 52 is held by Y-axis slide rail 50 so as to be slidable in the Y-axis direction. Further, Y-axis slide mechanism 32 includes electromagnetic motor (see FIG. 2) 56, and stage 52 moves to any position in the Y-axis direction by driving electromagnetic motor 56. This causes stage 52 to move to any position on base 28 by driving X-axis slide mechanism 30 and Y-axis slide mechanism 32.

Stage 52 includes base table 60, holding devices 62, and lifting and lowering device (see FIG. 2) 64. Base table 60 has a planar shape, and a board is placed on an upper face of base table 60. Holding devices 62 are each provided on a corresponding one of two side portions in the X-axis direction of base table 60. By interposing between holding devices 62 two edge portions in the X-axis direction of the board placed on base table 60, the board is fixedly held. Lifting and lowering device 64 is disposed below base table 60 and lifts and lowers base table 60.

First shaping unit 22 is a unit that shapes a wiring on board (see FIG. 3) 70 placed on base table 60 of stage 52, and includes first printing section 72, drying section 73, and baking section 74. First printing section 72 includes inkjet head (see FIG. 2) 76, and ejects a metal ink in the form of a line onto board 70 placed on base table 60. Metal ink contains metal particles dispersed in a solvent. Note that inkjet head 76 ejects, for example, conductive materials from multiple nozzles by using a piezoelectric system using a piezoelectric element.

Drying section 73 includes an infrared lamp (see FIG. 2) 77. Infrared lamp 77 is a device that irradiates a metal ink ejected onto board 70 with infrared rays, and, by irradiating the metal ink with infrared rays, a solvent contained in the metal ink is vaporized, and the metal ink is brought into a dried state. Baking section 74 includes laser irradiation device (see FIG. 2) 78. Laser irradiation device 78 is a device that irradiates the metal ink ejected onto board 70 with a laser; and bakes the metal ink irradiated with the laser to form a wiring. Note that, baking of metal ink is a phenomenon that, by applying energy, performs, for example, vaporization of solvent or breakdown of metal particle protective coating, and increases conductivity by making the metal particles contact or fuse. Then, a metal wiring is formed by the metal ink being baked.

Second shaping unit 24 is a unit that shapes a resin layer on board 70 placed on base table 60 of stage 52; and includes second printing section 84 and curing section 86. Second printing section 84 includes inkjet head (see FIG. 2) 88 and ejects an ultraviolet curable resin onto board 70 placed on base table 60. Note that inkjet head 88 may be, for example, a piezoelectric system using a piezoelectric element or a thermal system that heats resin, generates bubbles, and ejects the bubbles from nozzles.

Curing section 86 includes flattening device (see FIG. 2) 90 and irradiation device (see FIG. 2) 92. Flattening device 90 flattens an upper face of the ultraviolet curable resin ejected onto board 70 by inkjet head 88; and, by scraping up by a roller or a blade excess resin while leveling a face of the ultraviolet curable resin, causes the thickness of the ultraviolet curable resin to become uniform. Irradiation device 92 is also provided with a mercury lamp or an LED, as a light source, and irradiates the ultraviolet curable resin ejected onto board 70 with ultraviolet rays. This causes the ultraviolet curable resin ejected onto board 70 to be cured to shape the resin layer.

Figure 2:
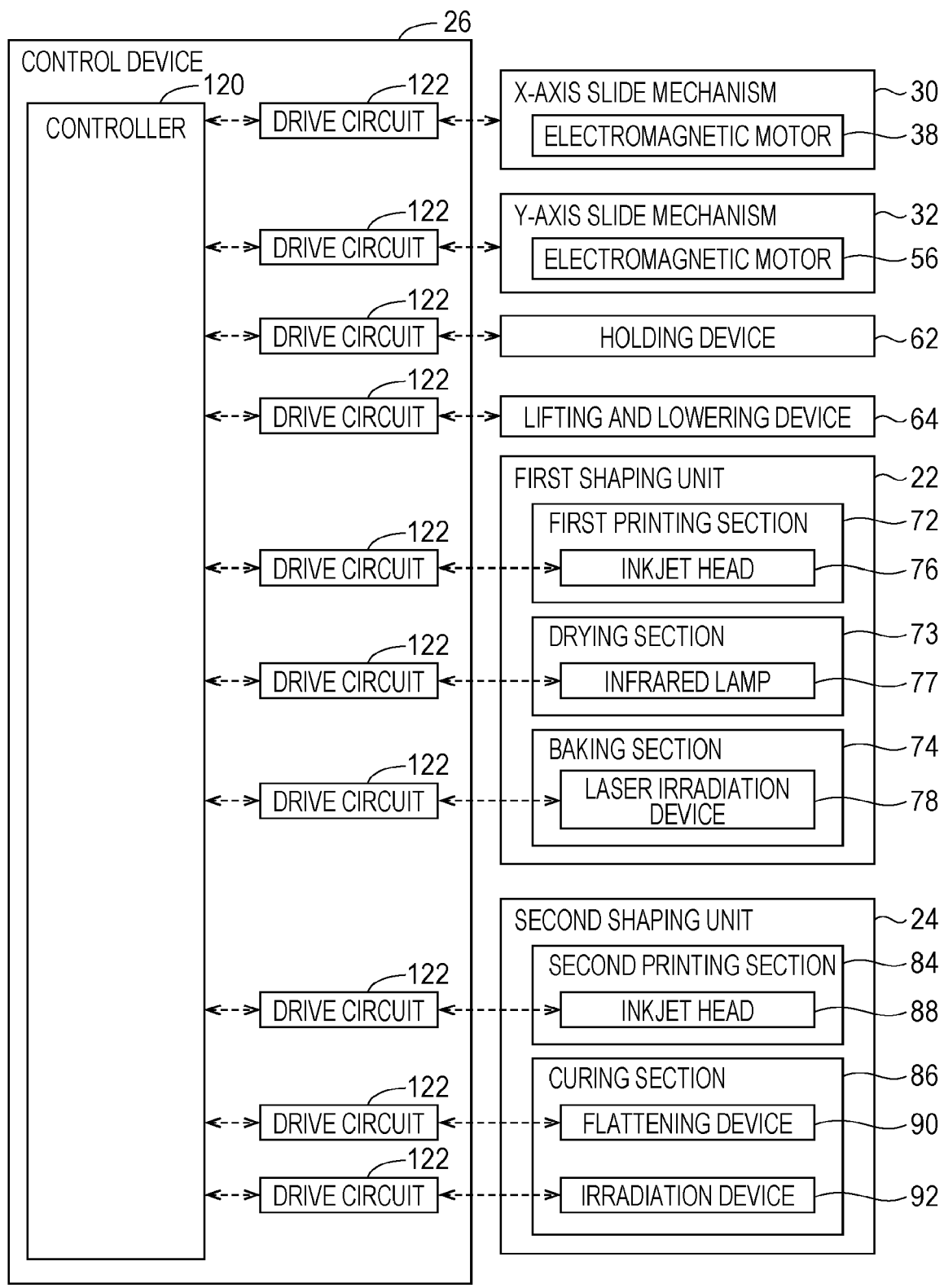
FIG. 2 is a block diagram showing a control device.

As shown in FIG. 2, control device 26 is provided with controller 120 and multiple drive circuits 122. Multiple drive circuits 122 are each connected to a corresponding one or ones of aforementioned electromagnetic motors 38 and 56, holding devices 62, lifting and lowering device 64, inkjet head 76, infrared lamp 77, laser irradiation device 78, inkjet head 88, flattening device 90, and irradiation device 92.

Controller 120 is provided with, for example, CPU, ROM, and RAM, is mainly a computer, and is connected to multiple drive circuits 122. By this, operations of conveyance device 20, first shaping unit 22, and second shaping unit 24 are controlled by controller 120.

Operation of Circuit Forming Device

Figure 3:
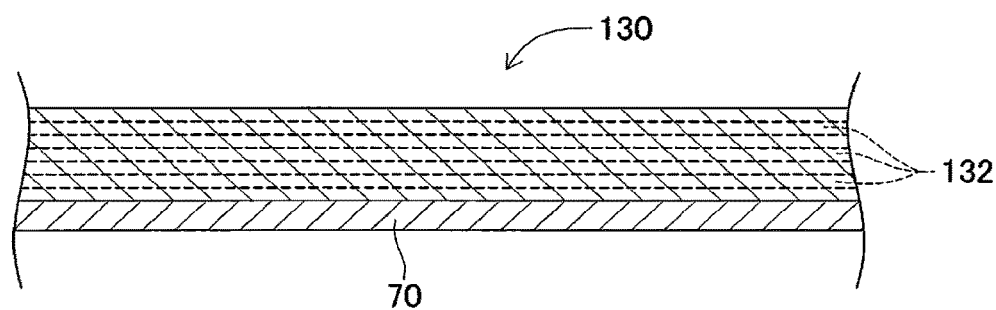
FIG. 3 is a sectional view showing a circuit in a state in which a resin laminated body has been formed.

In circuit forming device 10, due to the above-described configuration, a circuit pattern is formed on board 70. Specifically, board 70 is set on base table 60 of stage 52, and stage 52 is moved to a location below second shaping unit 24. Then, in second shaping unit 24, as shown in FIG. 3, resin laminated body 130 is formed on board 70. Resin laminated body 130 is formed by repeating the ejection of an ultraviolet curable resin from inkjet head 88 and the irradiation of the ejected ultraviolet curable resin with ultraviolet rays by irradiation device 92.

Specifically, in second printing section 84 of second shaping unit 24, inkjet head 88 ejects an ultraviolet curable resin in the form of a thin film onto the upper face of board 70. Next, when the ultraviolet curable resin has been ejected in the form of a thin film, in curing section 86, the ultraviolet curable resin is flattened by flattening device 90 such that the film thickness of the ultraviolet curable resin becomes uniform. Then, irradiation device 92 irradiates the thin-film ultraviolet curable resin with ultraviolet rays. By this, thin-film resin layer 132 is formed on board 70.

Next, inkjet head 88 ejects an ultraviolet curable resin in the form of a thin film onto thin-film resin layer 132. Then, by flattening the thin-film ultraviolet curable resin by flattening device 90 and irradiating the ultraviolet curable resin ejected in the form of a thin film by irradiation device 92, thin-film resin layer 132 is laminated to thin-film resin layer 132. In this way, by repeating the ejection of an ultraviolet curable resin onto thin-film resin layer 132 and the irradiation with ultraviolet rays, multiple resin layers 132 are laminated, thereby forming resin laminated body 130.

Figure 4:
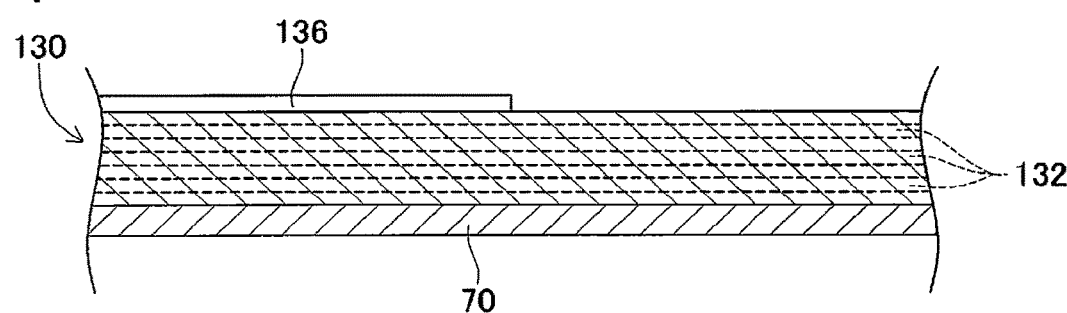
FIG. 4 is a sectional view showing the circuit in a state in which a wiring has been formed on the resin laminated body.

When resin laminated body 130 is formed by performing the above-described procedure, stage 52 is moved to a location below first shaping unit 22. Then, in first printing section 72, inkjet head 76 ejects a metal ink in the form of a line onto an upper face of resin laminated body 130 in accordance with a planned formation position of a wiring, that is, a circuit pattern. Next, in drying section 73, infrared lamp 77 irradiates the metal ink with infrared rays. This causes a solvent contained in the metal ink to be vaporized and the metal ink to be brought into a dried state. Then, in baking section 74, the dried metal ink is irradiated with a laser by laser irradiation device 78. By this, the metal ink is baked and, as shown in FIG. 4, wiring 136 is formed on resin laminated body 130. In this way, in circuit forming device 10, by forming resin laminated body 130 by using ultraviolet curable resin and forming wiring 136 by using metal ions, a circuit pattern is formed on board 70.

Figure 5:
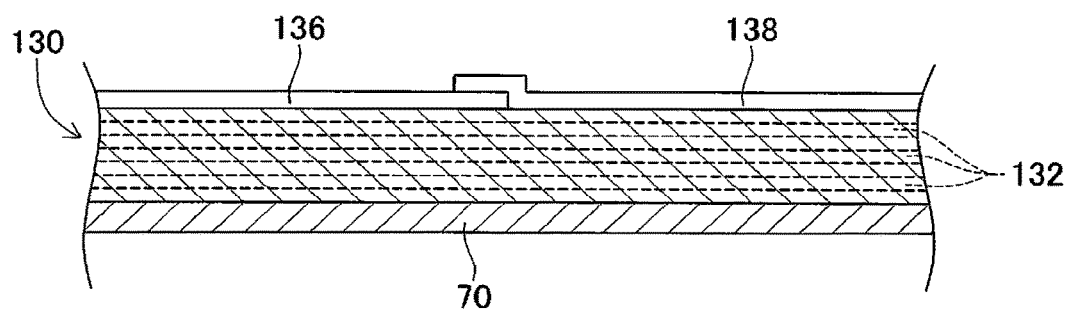
FIG. 5 is a sectional view showing the circuit in a state in which a metal ink has been ejected onto the wiring on the resin laminated body.

In accordance with a pattern of the circuit pattern, a different wiring, that is, a second wiring may be connected to wiring 136. In such a case, in first printing section 72, as shown in FIG. 5, in an overlapped state with a planned connection position for connection to wiring 136, inkjet head 76 ejects metal ink 138 to a planned formation position of the second wiring. Then, the second wiring is formed by drying and sintering the metal ink. However, the second wiring may be broken at a portion that is connected to wiring 136.

Figure 6:
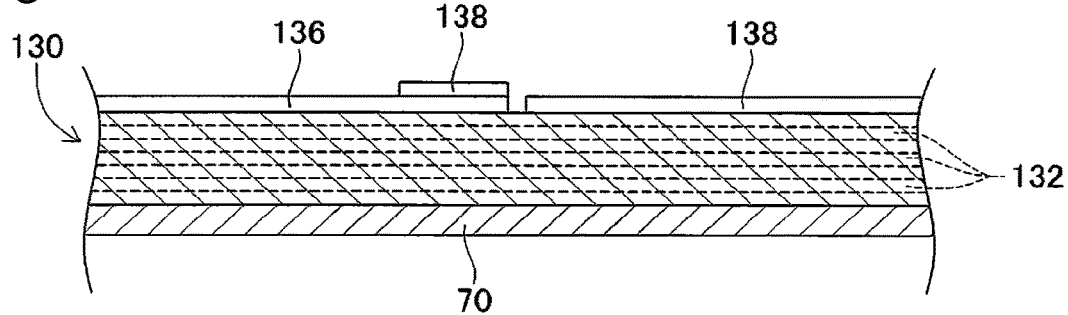
FIG. 6 is a sectional view showing the circuit in a state in which the metal inks have been separated.

Specifically, when, in order to form the second wiring, metal ink 138 is ejected to the planned formation position of the second wiring so as to be in an overlapped state with the planned connection position for connection to wiring 136, metal ink 138 is ejected onto a portion extending over an upper face of wiring 136 and the upper face of resin laminated body 130. Note that the upper face of wiring 136 has a high wettability and a contact angle that is less than or equal to 5 degrees. In contrast, the upper face of resin laminated body 130 has a low wettability and a contact angle that is approximately 25 degrees. Therefore, metal ink 138 ejected onto the upper face of wiring 136 spreads out, and metal ink 138 ejected onto resin laminated body 130 is pulled towards wiring 136. Here, metal ink 138 ejected onto resin laminated body 130 flows towards wiring 136, and as shown in FIG. 6, metal ink 138 ejected onto the upper face of wiring 136 and metal ink 138 ejected onto the upper face of resin laminated body 130 may be separated from each other. Then, when separated metal inks 138 are baked, the second wiring that is broken at a connection portion for connection to wiring 136 is formed.

Figure 7:
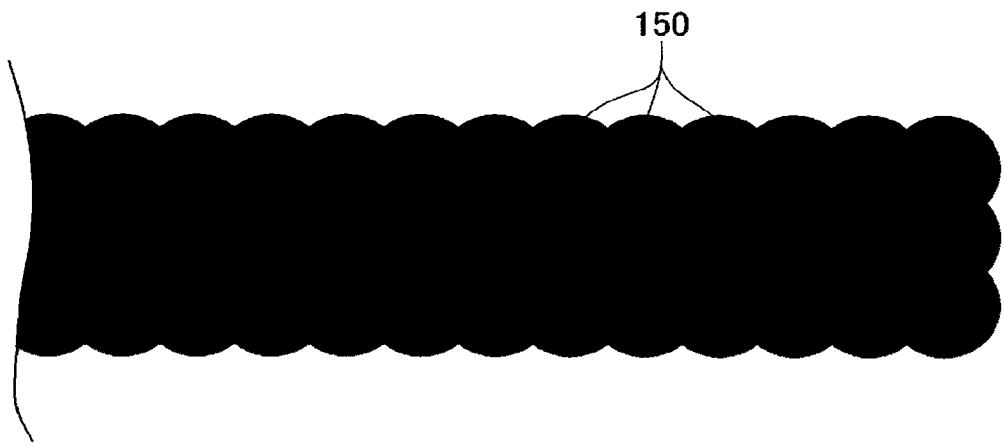
FIG. 7 is a schematic view showing a metal ink ejected to a planned formation position of a first wiring.

Taking account of this, in circuit forming device 10, the first wiring and the second wiring that is connected to the first wiring are formed in accordance with a technique that differs from the technique of related art. Specifically, in first printing section 72 of first shaping unit 22, as shown in FIG. 7, metal ink 150 is ejected to a planned formation position of the first wiring by inkjet head 76. Note that since inkjet head 76 ejects metal ink 150 in the form of droplets, ejected metal ink 150 is shown by using circles.

Figure 8:
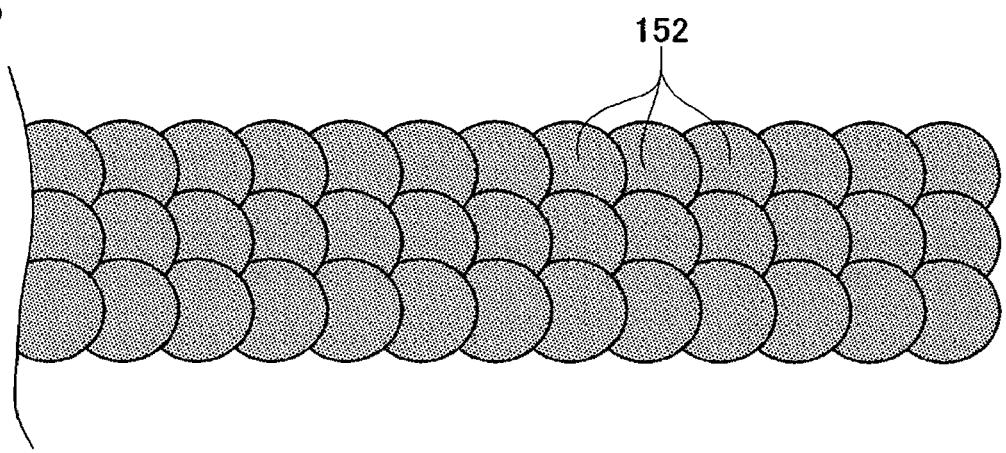
FIG. 8 is a schematic view showing the metal ink in a dried state.

Next, in drying section 73, metal ink 150 ejected by inkjet head 76 is irradiated in its entirety with infrared rays by infrared lamp 77. This causes metal ink 150 to be brought into a dried state. Note that, in order to distinguish between metal ink 150 before being dried and metal ink after being dried, metal ink 150 before being dried is shown black, and metal ink 150 after being dried is shown gray. Therefore, by irradiating metal ink 150 before being dried with infrared rays, metal ink 150 before being dried becomes dried metal ink 152 as shown in FIG. 8.

Figure 9:
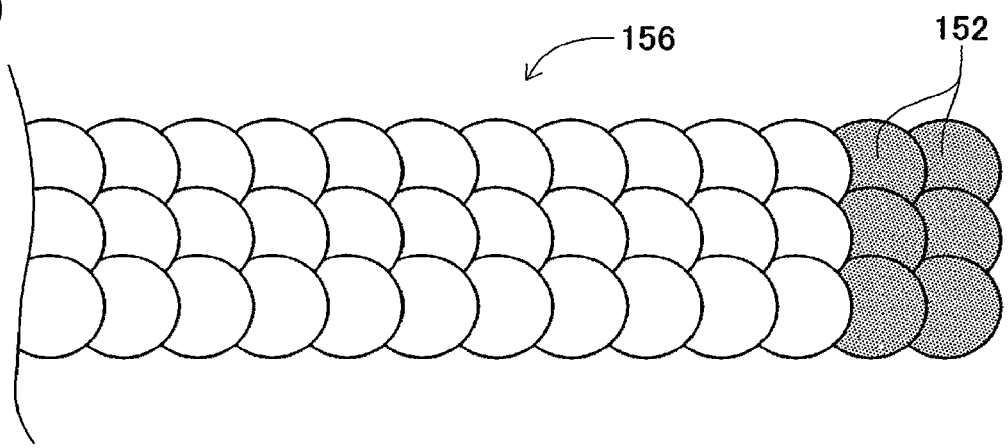
FIG. 9 is a schematic view showing the metal ink that has been baked excluding a planned connection section.

Then, in baking section 74, metal ink 152 is baked by irradiating dried metal ink 152 with a laser by laser irradiation device 78. However, dried metal ink 152 is not irradiated in its entirety; portions of metal ink 152 excluding a planned connection section of the first wiring and the second wiring are irradiated with the laser. By this, as shown in FIG. 9, at the planned connection section of the first wiring and the second wiring, metal ink 152 is kept in the dried state, and the portions of metal ink 152 other than the planned connection section are baked, and first wiring 156 is formed. Note that the baked metal ink, that is, the wiring is shown white.

Figure 10:
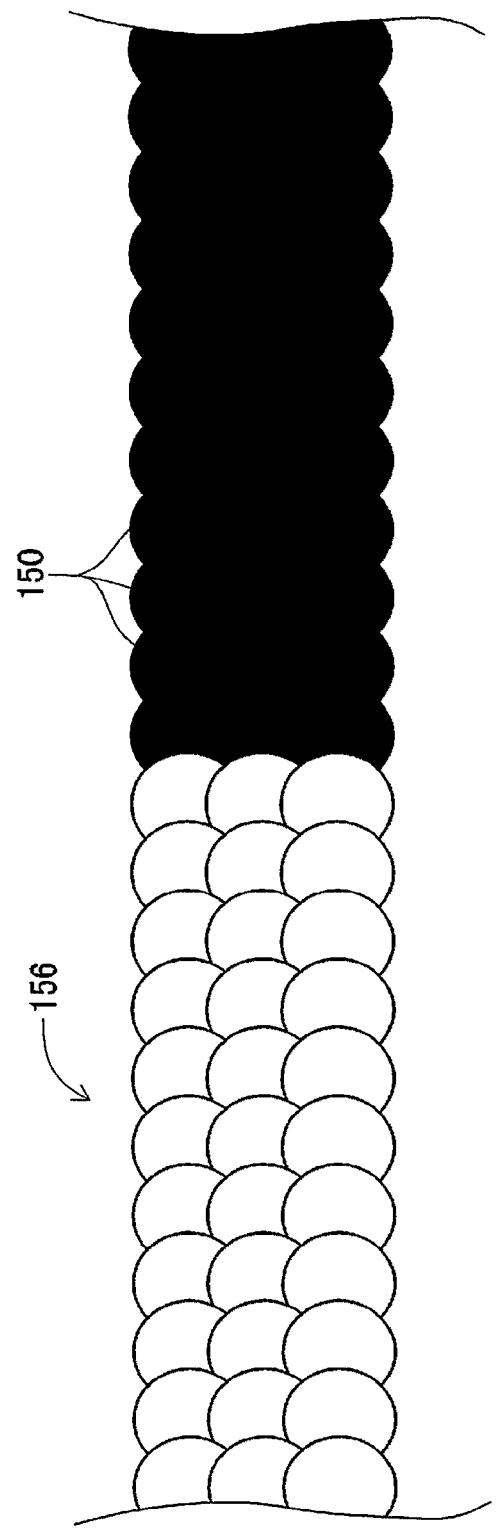
FIG. 10 is a schematic view showing the first wiring and a metal ink ejected in a connected state to the first wiring.

Next, in first printing section 72, as shown in FIG. 10, metal ink 150 is ejected onto the planned connection section of the first wiring and the second wiring and to the planned formation position of the second wiring by inkjet head 76. That is, metal ink 150 is ejected onto a portion extending over an upper face of metal ink 152 in FIG. 9 and the planned formation position of the second wiring at the upper face of resin laminated body 130. Note that the baked metal ink, that is, the upper face of the wiring has a high wettability; however, the upper face of dried metal ink 152 has a wettability that is equal to the wettability of the upper face of resin laminated body 130. Therefore, one of metal ink 150 ejected onto the upper face of metal ink 152 and metal ink 150 ejected onto the upper face of resin laminated body 130 does not flow towards the other of metal ink 150 ejected onto the upper face of metal ink 152 and metal ink 150 ejected onto the upper face of resin laminated body 130, so that metal ink 150 ejected onto the upper face of metal ink 152 and metal ink 150 ejected onto the upper face of resin laminated body 130 do not separate from each other. By this, metal ink 150 ejected onto the upper face of metal ink 152 and metal ink 150 ejected onto the upper face of resin laminated body 130 are kept in a continuous and connected state.

Figure 11:
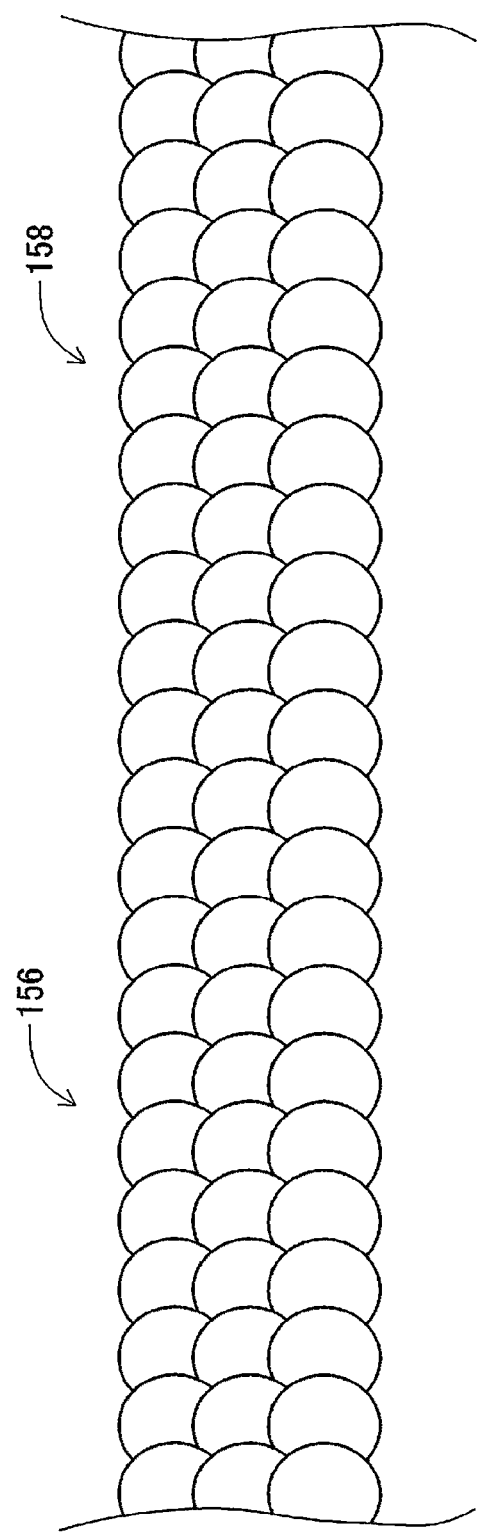
FIG. 11 is a schematic view showing the first wiring and a second wiring in a connected state.

Then, in drying section 73, metal ink 150 is dried by irradiating metal ink 150 with infrared rays, and, further, in baking section 74, dried metal ink 152 is irradiated with a laser. By this, as shown in FIG. 11, second wiring 158 in a connected state to first wiring 156 is formed. In this way, with the planned connection section of first wiring 156 being unbaked, by ejecting metal ink 150 onto a portion extending over the planned connection section and the planned formation position of the second wiring, it is possible to properly connect the first wiring and the second wiring to each other.

Figure 12:
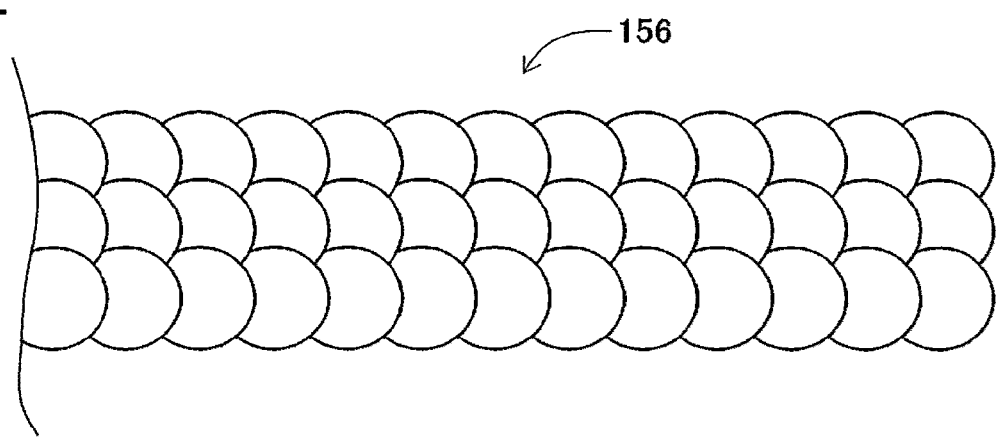
FIG. 12 is a schematic view showing the first wiring.

In circuit forming device 10, the first wiring and the second wiring that is connected to the first wiring can be formed in accordance with a second technique that differs from the first technique described earlier. Specifically, similarly to the first technique, in first printing section 72, as shown in FIG. 7, metal ink 150 is ejected to the planned formation position of the first wiring by inkjet head 76, and, further, in drying section 73, entire metal ink 150 is irradiated with infrared rays by infrared lamp 77. By this, as shown in FIG. 8, ejected metal ink 150 becomes dried metal ink 152. Then, in baking section 74, entire dried metal ink 152 is irradiated with a laser by laser irradiation device 78. By this, as shown in FIG. 12, entire metal ink 152 is baked, and first wiring 156 is formed.

Figure 13:
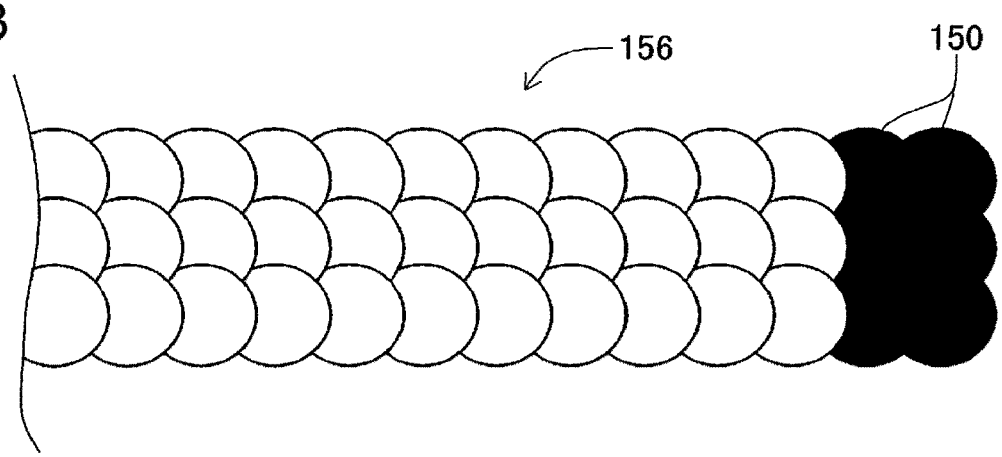
FIG. 13 is a schematic view showing the first wiring in a state in which a metal ink has been ejected onto the planned connection section.

Next, in first printing section 72, metal ink 150 is ejected onto the planned connection section of first wiring 156 and second wiring 158 by inkjet head 76. That is, as shown in FIG. 13, metal ink 150 is ejected onto the upper face of first wiring 156 to which second wiring 158 is to be connected. Then, in drying section 73, ejected metal ink 150 is irradiated with infrared rays. By this, as shown in FIG. 9, at the planned connection section, the upper face of first wiring 156 is covered with dried metal ink 152.

Next, in first printing section 72, as shown in FIG. 10, metal ink 150 is ejected onto the planned connection section of the first wiring and the second wiring and to the planned formation position of the second wiring by inkjet head 76. That is, metal ink 150 is ejected onto a portion extending over the upper face of dried metal ink 152 in FIG. 9 and the planned formation position of the second wiring at the upper face of resin laminated body 130. By this, since metal ink 150 is ejected onto a portion extending over metal ink 152 and resin laminated body 130 having equal wettability, metal ink 150 ejected onto the upper face of metal ink 152 and metal ink 150 ejected onto the upper face of resin laminated body 130 do not separate from each other, and are kept in a connected state.

Then, in drying section 73, metal ink 150 is dried by irradiating metal ink 150 with infrared rays, and, further, in baking section 74, dried metal ink 152 is irradiated with a laser. By this, as shown in FIG. 11, second wiring 158 in a connected state to first wiring 156 is formed. In this way, after forming first wiring 156, by ejecting metal ink 150 onto the planned connection section of first wiring 156, drying metal ink 150, and ejecting metal ink 150 onto a portion extending over dried metal ink 152 and the planned formation position of the second wiring, it is possible to properly connect the first wiring and the second wiring to each other.

Figure 14:
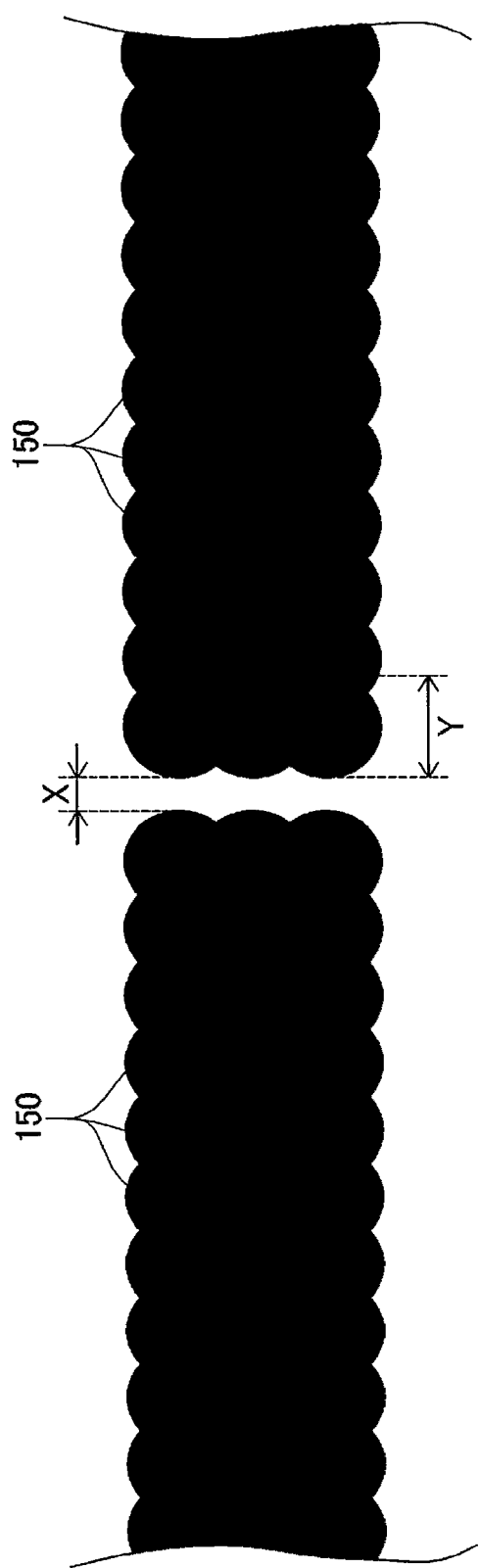
FIG. 14 is a schematic view showing a metal ink ejected to a planned formation position of the first wiring and a metal ink ejected to a planned formation position of the second wiring with a predetermined clearance from the metal ink ejected to the planned formation position of the first wiring.

Further, in circuit forming device 10, the first wiring and the second wiring that is connected to the first wiring can be formed in accordance with a third technique that differs from the two techniques described earlier. Specifically, in first printing section 72, metal ink 150 is ejected to the planned formation position of the first wiring by inkjet head 76. Further, as shown in FIG. 14, with a predetermined clearance X from the planned connection section of the first wiring and the second wiring, metal ink 150 is ejected to the planned formation position of the second wiring by inkjet head 76. Note that the predetermined clearance X is shorter than a diameter Y of each droplet of metal ink 150 that is ejected by inkjet head 76.

Figure 15:
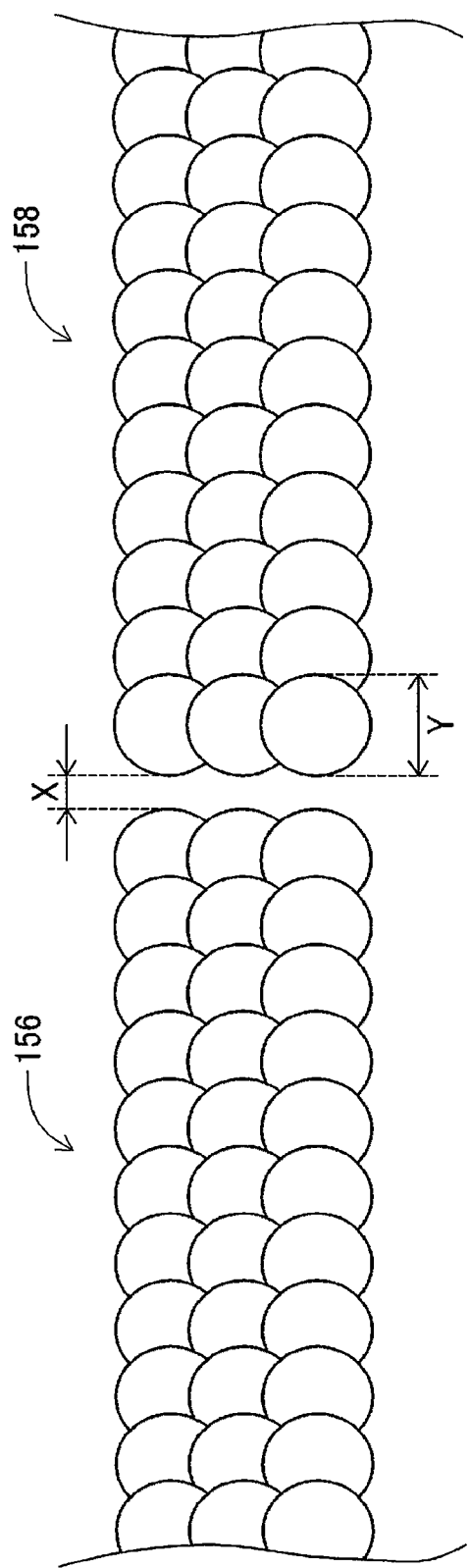
FIG. 15 is a schematic view showing the first wiring and the second wiring formed with the predetermined clearance from the first wiring.

Then, in drying section 73, metal ink 150 is dried by irradiating metal ink 150 with infrared rays, and, further, in baking section 74, dried metal ink 152 is irradiated with a laser. By this, as shown in FIG. 15, first wiring 156 and second wiring 158 are formed in a separated state with the predetermined clearance X therebetween.

Figure 16:
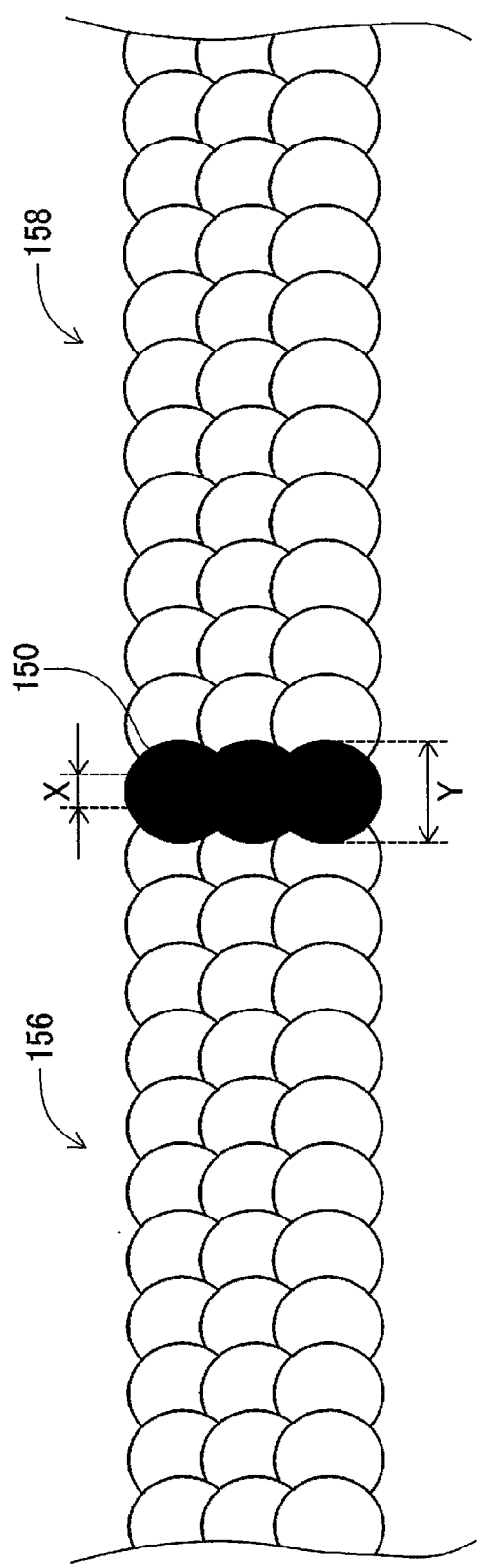
FIG. 16 is a schematic view showing the first wiring and the second wiring in a state in which they have been connected to each other by an ejected metal ink.

Next, in first printing section 72, as shown in FIG. 16, metal ink 150 is ejected into the clearance between first wiring 156 and second wiring 158 by inkjet head 76. Here, since the diameter Y of each droplet of metal ink 150 that is ejected by inkjet head 76 is longer than the clearance X between first wiring 156 and second wiring 158, the droplets of metal ink 150 exist at a portion extending over first wiring 156 and second wiring 158. The droplets of metal ink 150 existing at the portion extending over the first wiring 156 and the second wiring 158 are pulled towards both second wiring 158 and first wiring 156 where they tend to spread out. However, since the droplets of metal ink 150 are pulled by a substantially equal force from both end portions in a radial direction, the droplets do not flow towards first wiring 156 and second wiring 158. By this, first wiring 156 and second wiring 158 are kept in a connected state by the droplets of metal ink 150.

Then, in drying section 73, metal ink 150 is dried by irradiating metal ink 150 with infrared rays, and, further, in baking section 74, dried metal ink 152 is irradiated with a laser. By this, as shown in FIG. 11, first wiring 156 and second wiring 158 are formed in a connected state. In this way, after forming first wiring 156 and second wiring 158 with the predetermined clearance therebetween, by ejecting metal ink 150 onto the portion extending over first wiring 156 and second wiring 158 and drying and baking metal ink 150, it is possible to properly connect the first wiring and the second wiring to each other.

Figure 17:
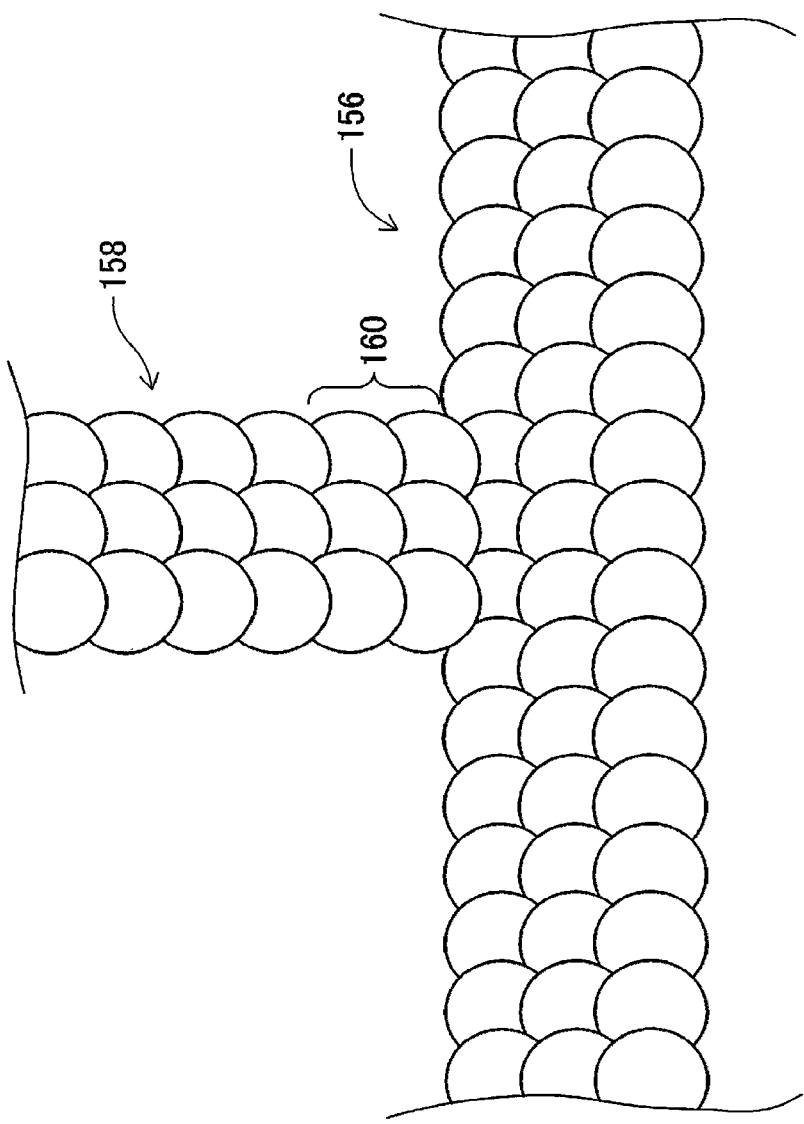
FIG. 17 is a schematic view showing the first wiring and the second wiring in a state in which they have been connected to each other in a T-shape.

In the description above, second wiring 158 is connected to an end portion of first wiring 156; however, second wiring 158 may be connected to a portion of first wiring 156 differing from an end portion of first wiring 156. Specifically, for example, as shown in FIG. 17, second wiring 158 may be connected to first wiring 156 in a T-shape at a location between both end portions of first wiring 156. In such a case, first wiring 156 is provided with a protruding portion that protrudes towards second wiring 158, and second wiring 158 is connected to the protruding portion. In this case, by applying the first technique described earlier, first wiring 156 and second wiring 158 are connected to each other in a T shape.

Figure 18:
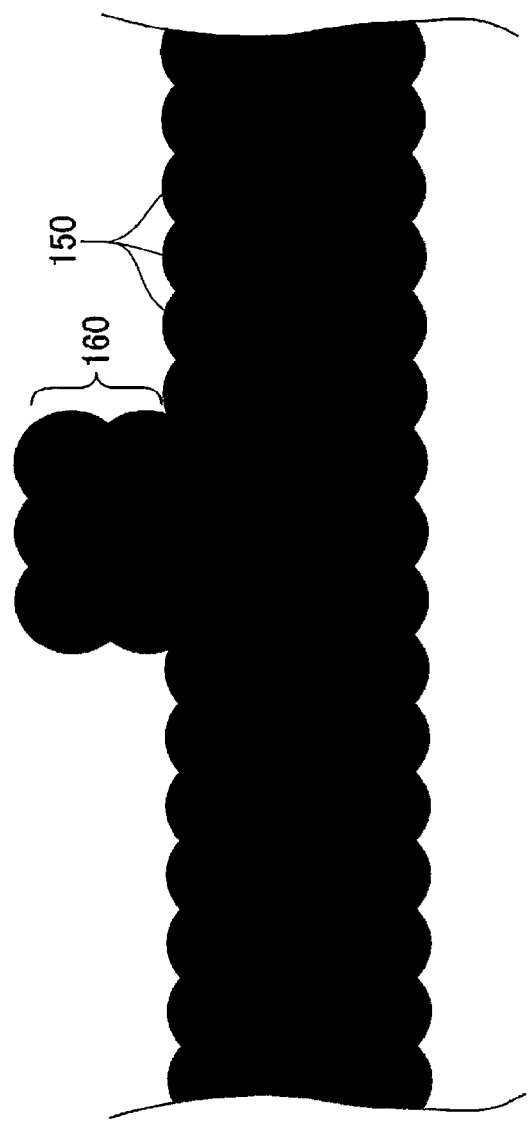
FIG. 18 is a schematic view showing a metal ink ejected to the planned formation position of the first wiring and onto a protruding portion.

Specifically, in first printing section 72, metal ink 150 is ejected to the planned formation position of the first wiring by inkjet head 76. Here, as shown in FIG. 18, metal ink 150 is not only ejected to the planned formation position of the first wiring, but is also ejected so as to protrude towards the planned formation position of the second wiring. Note that the portion that protrudes towards the planned formation position of the second wiring may be called protruding portion 160. The width of protruding portion 160, that is, the dimension in a direction orthogonal to the protruding direction is the same as the width of second wiring 158.

Figure 19:
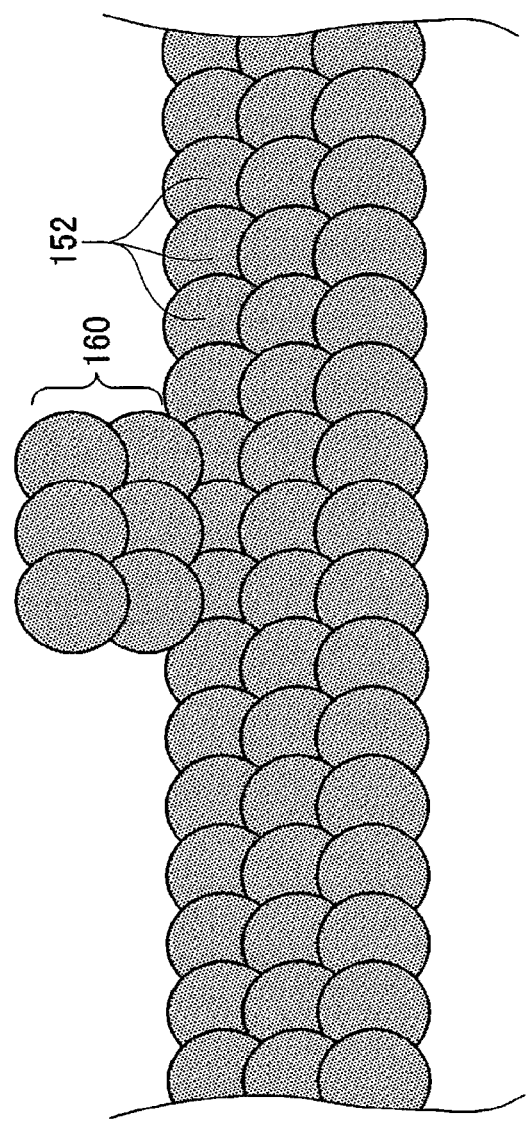
FIG. 19 is a schematic view showing the metal ink in a dried state.
Figure 20:
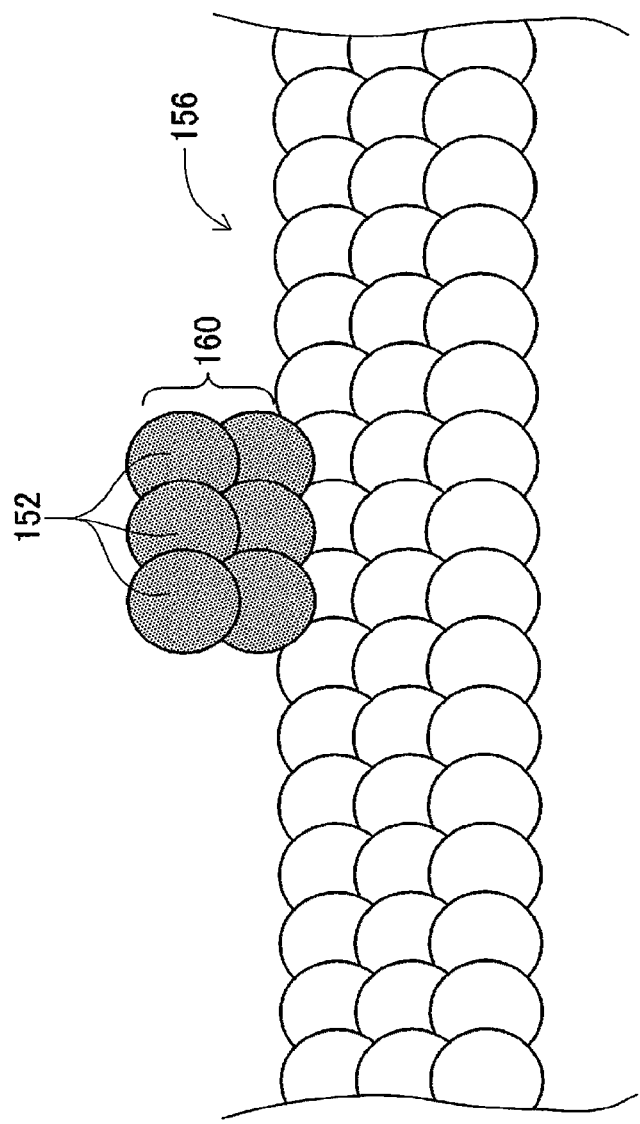
FIG. 20 is a schematic view showing the metal ink that has been baked excluding the protruding portion.

Next, in drying section 73, metal ink 150 ejected by inkjet head 76 is irradiated in its entirety with infrared rays by infrared lamp 77. By this, as shown in FIG. 19, entire ejected metal ink 150 becomes dried metal ink 152. Then, in baking section 74, metal ink 152 is baked by irradiating dried metal ink 152 with a laser by laser irradiation device 78. Here, dried metal ink 152 is not irradiated in its entirety with a laser; portions of metal ink 152 excluding protruding portion 160 are irradiated with the laser. By this, as shown in FIG. 20, at the protruding portion 160, metal ink 152 is kept in the dried state, and the portions of metal ink 152 other than the protruding portion 160 are baked, and first wiring 156 is formed.

Figure 21:
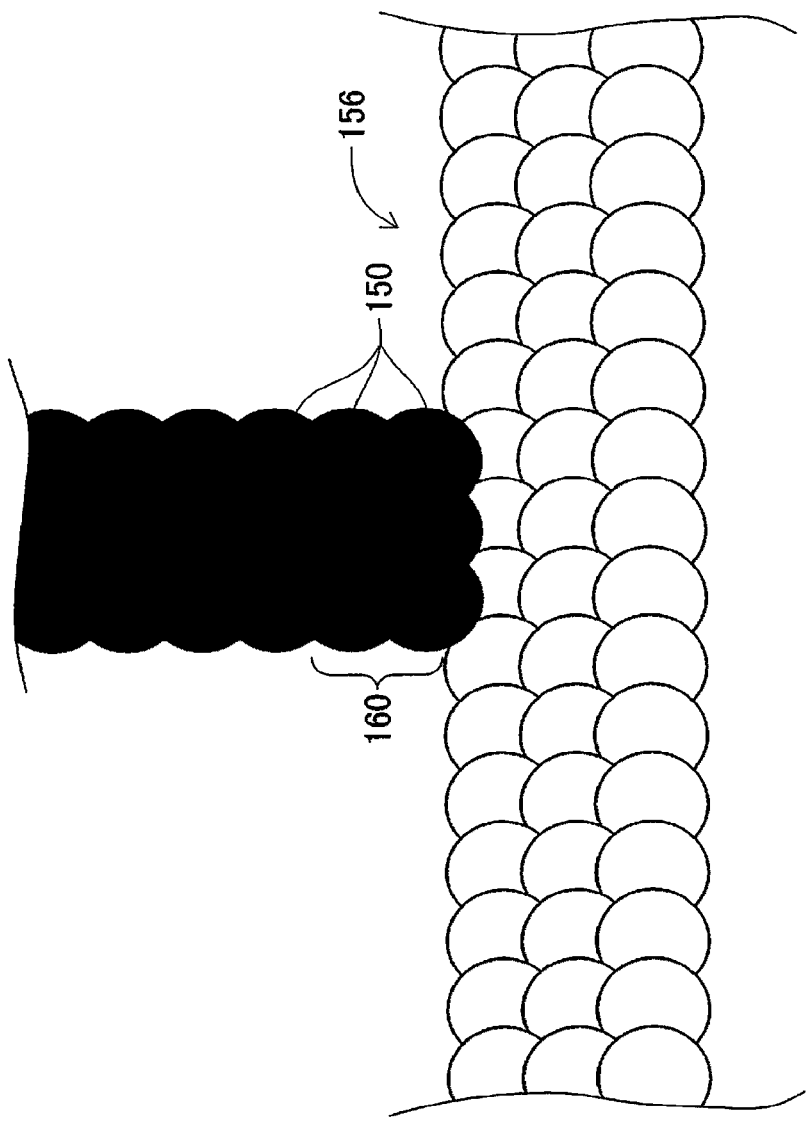
FIG. 21 is a schematic view showing the first wiring and a metal ink ejected in a state in which the metal ink has been connected to the first wiring.

Next, in first printing section 72, as shown in FIG. 21, metal ink 150 is ejected onto protruding portion 160 and to the planned formation position of the second wiring by inkjet head 76. That is, metal ink 150 is ejected onto a portion extending over an upper face of metal ink 152 of protruding portion 160 in FIG. 20 and the planned formation position of the second wiring at the upper face of resin laminated body 130. By this, since metal ink 150 is ejected onto a portion extending over metal ink 152 and resin laminated body 130 having equal wettability, metal ink 150 ejected onto the upper face of metal ink 152 and metal ink 150 ejected onto the upper face of resin laminated body 130 do not separate from each other, and are kept in a connected state.

Then, in drying section 73, metal ink 150 is dried by irradiating metal ink 150 with infrared rays, and, further, in baking section 74, dried metal ink 152 is irradiated with a laser. By this, as shown in FIG. 17, second wiring 158 in a connected state in a T shape to first wiring 156 is formed. In this way, by providing first wiring 156 with protruding portion 160, causing protruding portion 160 to function as the planned connection section of first wiring 156 and second wiring 158, and applying the first technique described earlier, it is possible to properly connect first wiring 156 and second wiring 158 to each other in a T shape.

Figure 22:
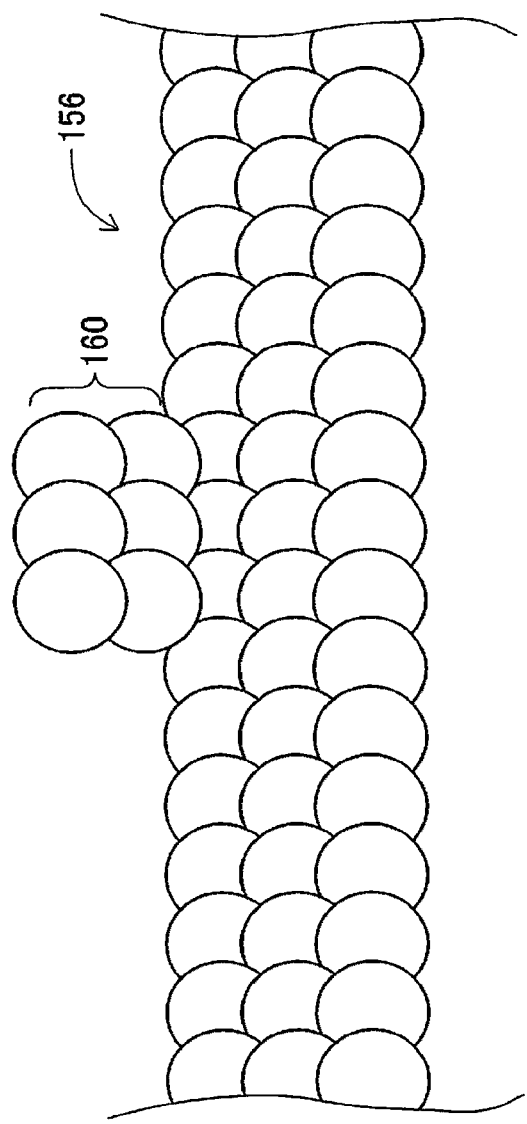
FIG. 22 is a schematic view showing the first wiring including the protruding portion.

When first wiring 156 and second wiring 158 are to be connected to each other in a T shape, it is possible to apply the second technique described earlier. Specifically, similarly to the first technique, in first printing section 72, as shown in FIG. 18, metal ink 150 is ejected to the planned formation position of the first wiring and protruding portion 160 by inkjet head 76, and, further, in drying section 73, entire metal ink 150 is irradiated with infrared rays by infrared lamp 77. By this, as shown in FIG. 19, ejected metal ink 150 becomes dried metal ink 152. Then, in baking section 74, entire dried metal ink 152 is irradiated with a laser by laser irradiation device 78. By this, as shown in FIG. 22, entire metal ink 152 is baked, and first wiring 156 is formed.

Figure 23:
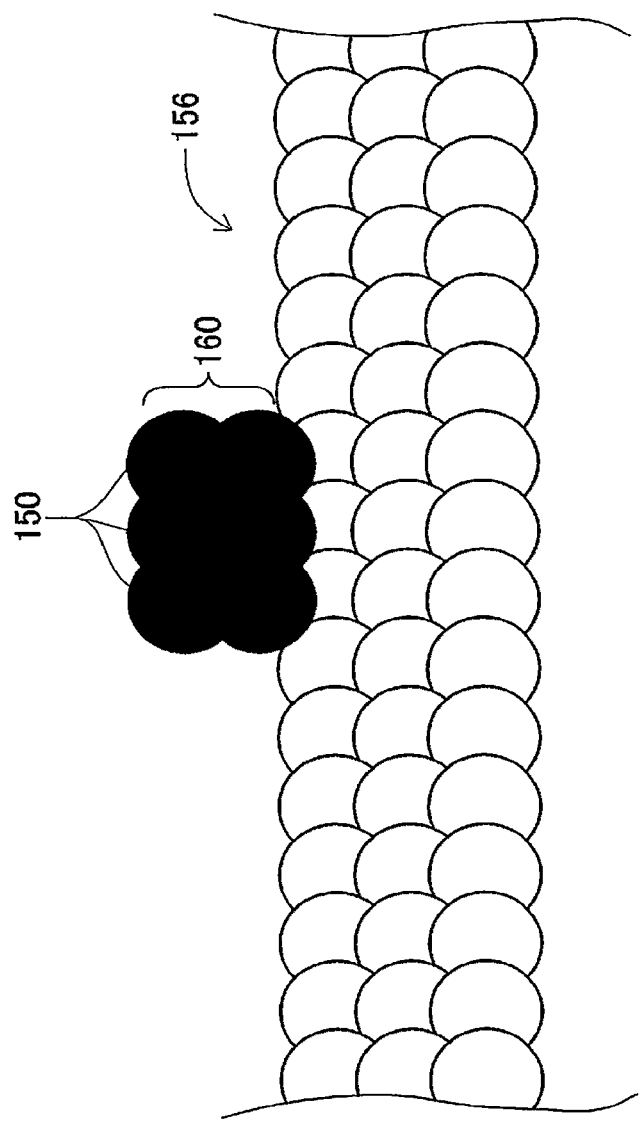
FIG. 23 is a schematic view showing the first wiring in a state in which a metal ink has been ejected onto the protruding portion.

Next, in first printing section 72, metal ink 150 is ejected onto the protruding portion 160 by inkjet head 76. That is, as shown in FIG. 23, metal ink 150 is ejected onto an upper face of protruding portion 160 of first wiring 156. Here, metal ink 150 is spread only on the upper face of protruding portion 160 and has a width that is the same as the width of protruding portion 160. Then, in drying section 73, ejected metal ink 150 is irradiated with infrared rays. By this, as shown in FIG. 20, at protruding portion 160, an upper face of first wiring 156 is covered with dried metal ink 152.

Next, in first printing section 72, as shown in FIG. 21, metal ink 150 is ejected onto protruding portion 160 and to the planned formation position of the second wiring by inkjet head 76. That is, metal ink 150 is ejected onto a portion extending over the upper face of dried metal ink 152 in FIG. 20 and the planned formation position of the second wiring at the upper face of resin laminated body 130. By this, since metal ink 150 is ejected onto a portion extending over metal ink 152 and resin laminated body 130 having equal wettability, metal ink 150 ejected onto the upper face of metal ink 152 and metal ink 150 ejected onto the upper face of resin laminated body 130 do not separate from each other, and are kept in a connected state.

Then, in drying section 73, metal ink 150 is dried by irradiating metal ink 150 with infrared rays, and, further, in baking section 74, dried metal ink 152 is irradiated with a laser. By this, as shown in FIG. 17, second wiring 158 in a connected state in a T shape to first wiring 156 is formed. In this way, by providing first wiring 156 with protruding portion 160, causing protruding portion 160 to function as the planned connection section of first wiring 156 and second wiring 158, and applying the second technique described earlier, it is possible to properly connect first wiring 156 and second wiring 158 to each other in a T shape. When metal ink 150 has been ejected onto protruding portion 160, the width of metal ink 150 is equal to the width of protruding portion 160, that is, the width of second wiring 158. By this, a portion of second wiring 158 that is connected to first wiring 156 can have a width that is the same as the width of second wiring 158.

Figure 24:
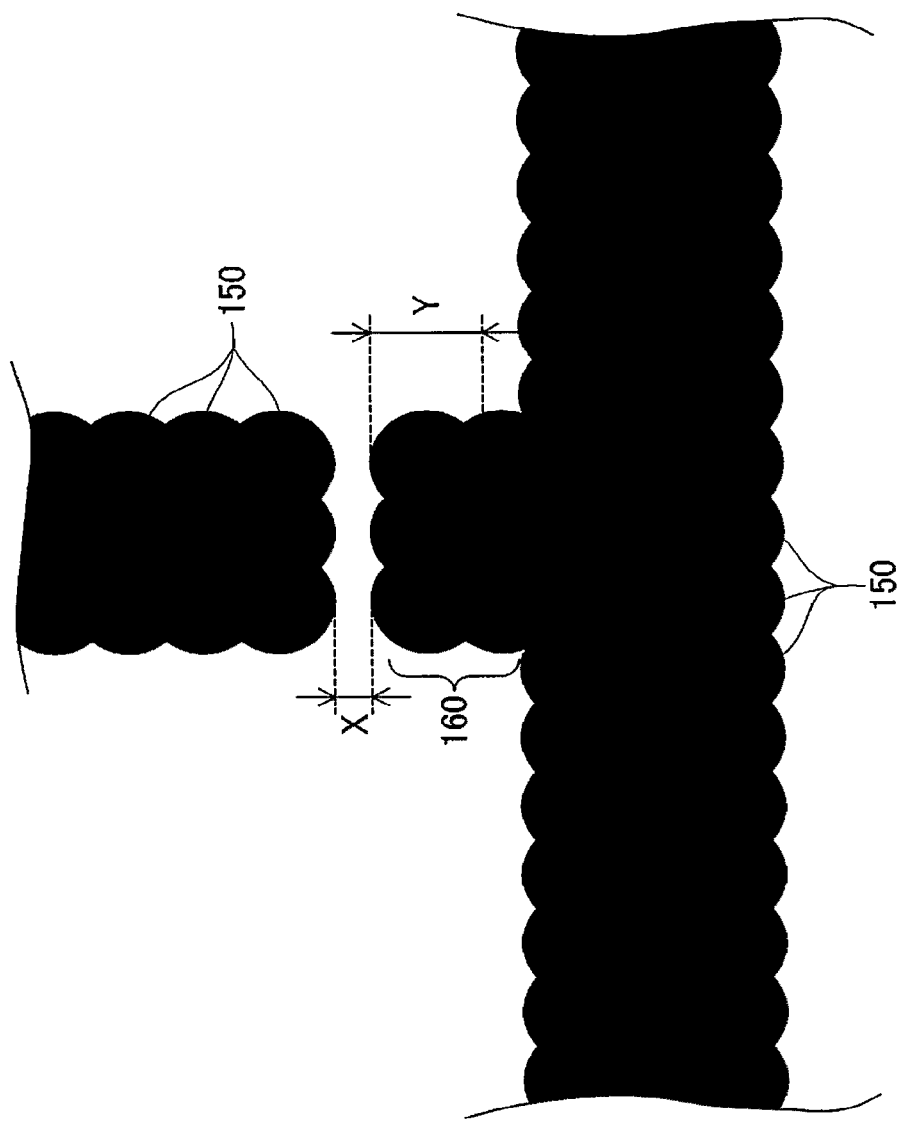
FIG. 24 is a schematic view showing the metal ink ejected onto the protruding portion and to the planned formation position of the first wiring and the metal ink ejected to the planned formation position of the second wiring with a predetermined clearance from the protruding portion.

When first wiring 156 and second wiring 158 are to be connected to each other in a T shape, it is possible to apply the third technique described earlier. Specifically, in first printing section 72, as shown in FIG. 24, metal ink 150 is ejected to the planned formation position of the first wiring and protruding portion 160 by inkjet head 76. Further, with a predetermined clearance X from protruding portion 160, metal ink 150 is ejected to the planned formation position of the second wiring by inkjet head 76. Note that the predetermined clearance X is shorter than a diameter Y of each droplet of metal ink 150 that is ejected by inkjet head 76.

Figure 25:
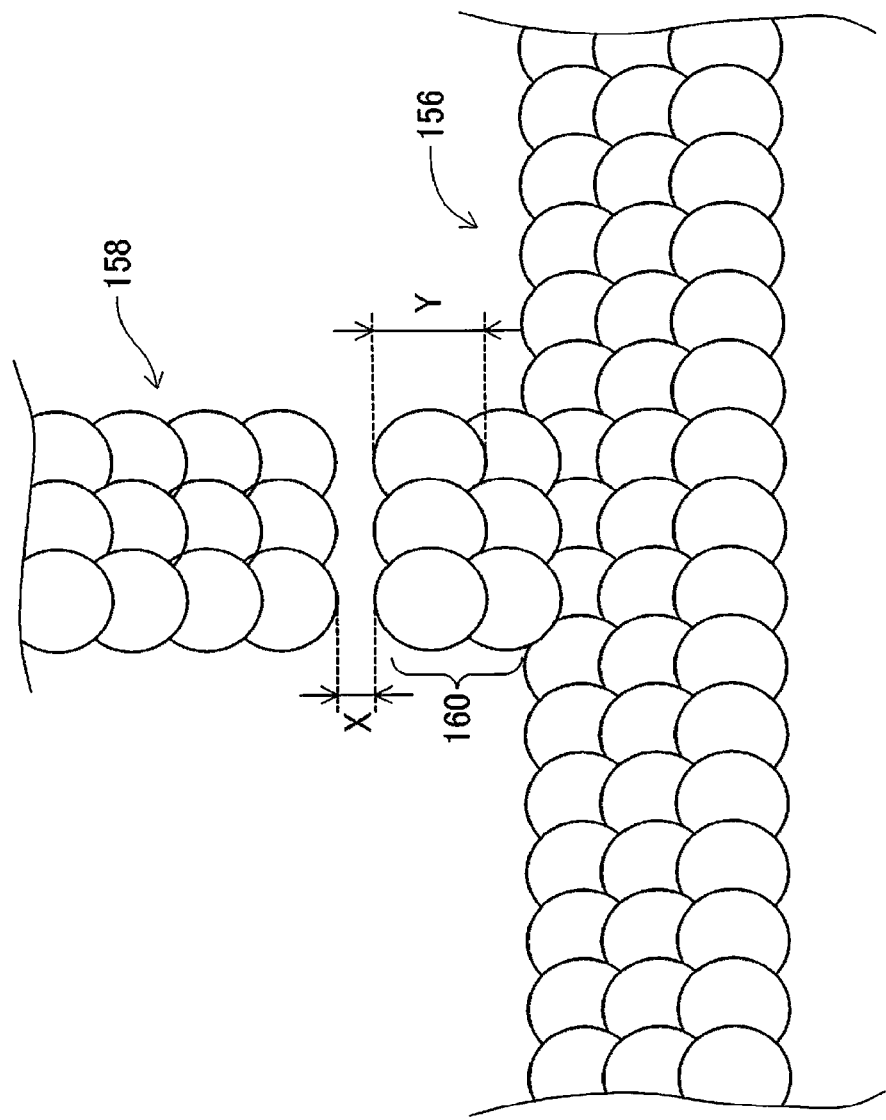
FIG. 25 is a schematic view showing the first wiring including the protruding portion and the second wiring formed with the predetermined clearance from the protruding portion.

Then, in drying section 73, metal inks 150 are dried by irradiating metal ink 150 with infrared rays, and, further, in baking section 74, dried metal inks 152 are irradiated with a laser. By this, as shown in FIG. 25, first wiring 156 and second wiring 158 in a separated state with the predetermined clearance X therebetween are formed.

Figure 26:
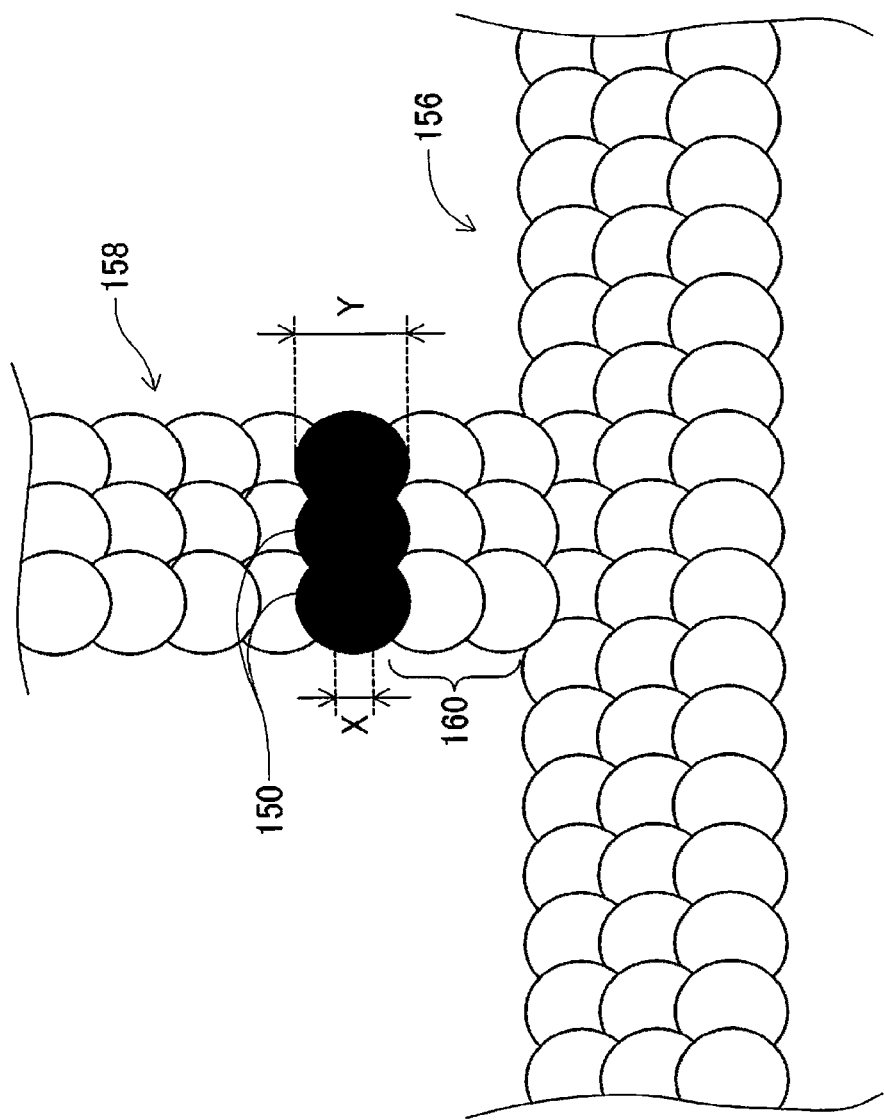
FIG. 26 is a schematic view showing the first wiring and the second wiring in a state in which they have been connected to each other by an ejected metal ink.

Next, in first printing section 72, as shown in FIG. 26, metal ink 150 is ejected into the clearance between first wiring 156 and second wiring 158 by inkjet head 76. Here, since the droplets of metal ink 150 exist on a portion extending over first wiring 156 and second wiring 158, and are pulled from both end portions in a radial direction by a substantially equal force, the droplets do not flow towards first wiring 156 and second wiring 158. By this, first wiring 156 and second wiring 158 are kept in a connected state by the droplets of metal ink 150.

Then, in drying section 73, metal ink 150 is dried by irradiating metal ink 150 with infrared rays, and, further, in baking section 74, dried metal ink 152 is irradiated with a laser. By this, as shown in FIG. 17, first wiring 156 and second wiring 158 are formed in a connected state in a T shape. In this way, by providing first wiring 156 with protruding portion 160, causing protruding portion 160 to function as the planned connection section of first wiring 156 and second wiring 158, and applying the third technique described earlier, it is possible to properly connect first wiring 156 and second wiring 158 to each other in a T shape.

Figure 27:
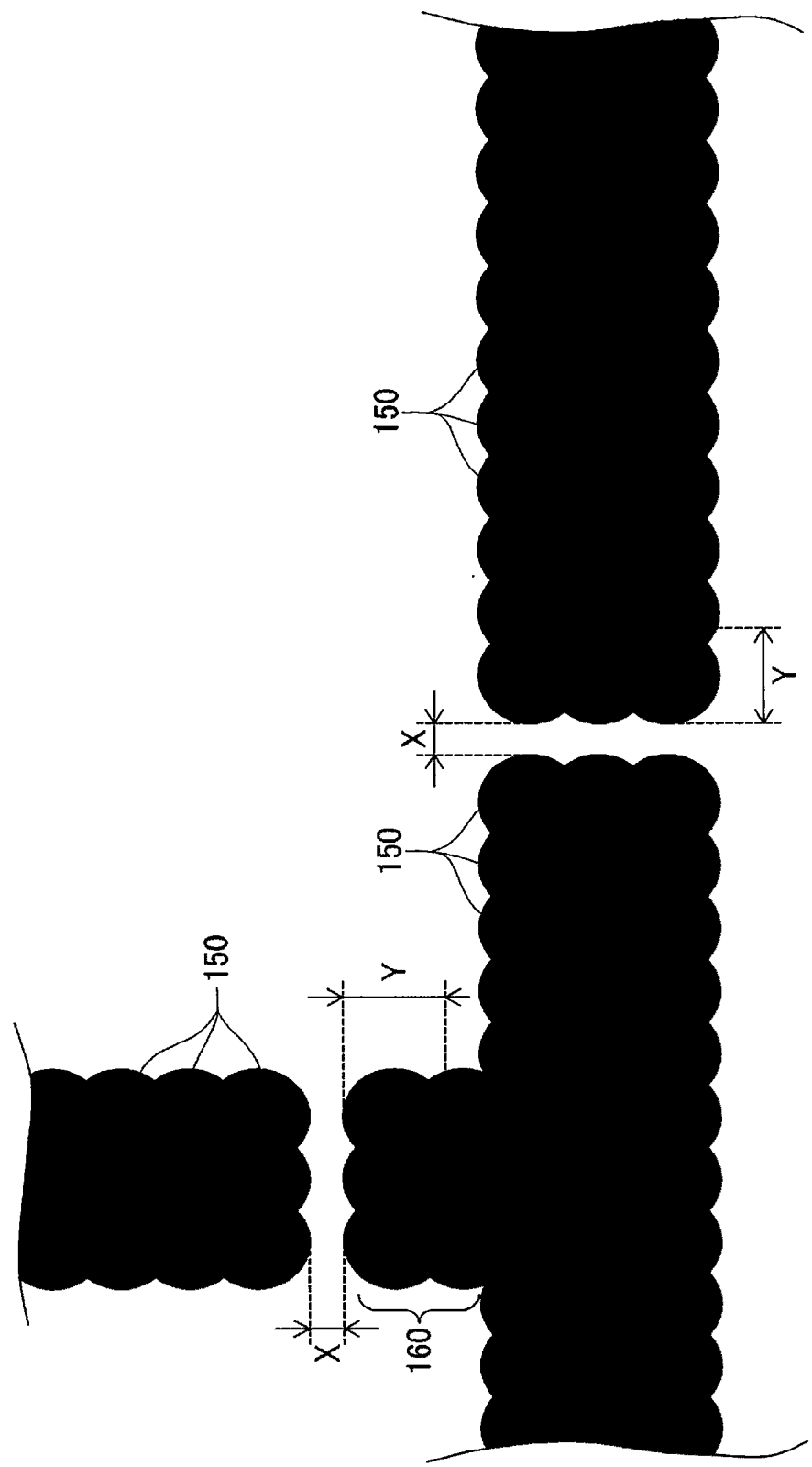
FIG. 27 is a schematic view showing the metal ink ejected onto the protruding portion and to the planned formation position of the first wiring, the metal ink ejected to the planned formation position of the second wiring with a predetermined clearance from an end portion of the metal ink ejected onto the protruding portion and the planned formation position of the first wiring, and a metal ink ejected to a planned formation position of a third wiring with a predetermined clearance from the protruding portion.

Note that, when three or more wirings are to be formed in a connected state in accordance with the third technique described earlier, after forming the three or more wirings with clearances therebetween, by ejecting metal ink 150 into each clearance, it is possible to aim at, for example, improving the efficiency of a wiring connection step and increasing throughput. Specifically, in first printing section 72, as shown in FIG. 27, metal ink 150 is ejected to the planned formation position of the first wiring and protruding portion 160 by inkjet head 76. Further, with a predetermined clearance X existing from an end portion of metal ink 150 ejected to the planned formation position of first wiring, metal ink 150 is ejected to the planned formation position of the second wiring by inkjet head 76. Further, with a predetermined clearance X from protruding portion 160, metal ink 150 is ejected to a planned formation position of a third wiring by inkjet head 76. Note that the predetermined clearances X are shorter than a diameter Y of each droplet of metal ink 150 that is ejected by inkjet head 76.

Figure 28:
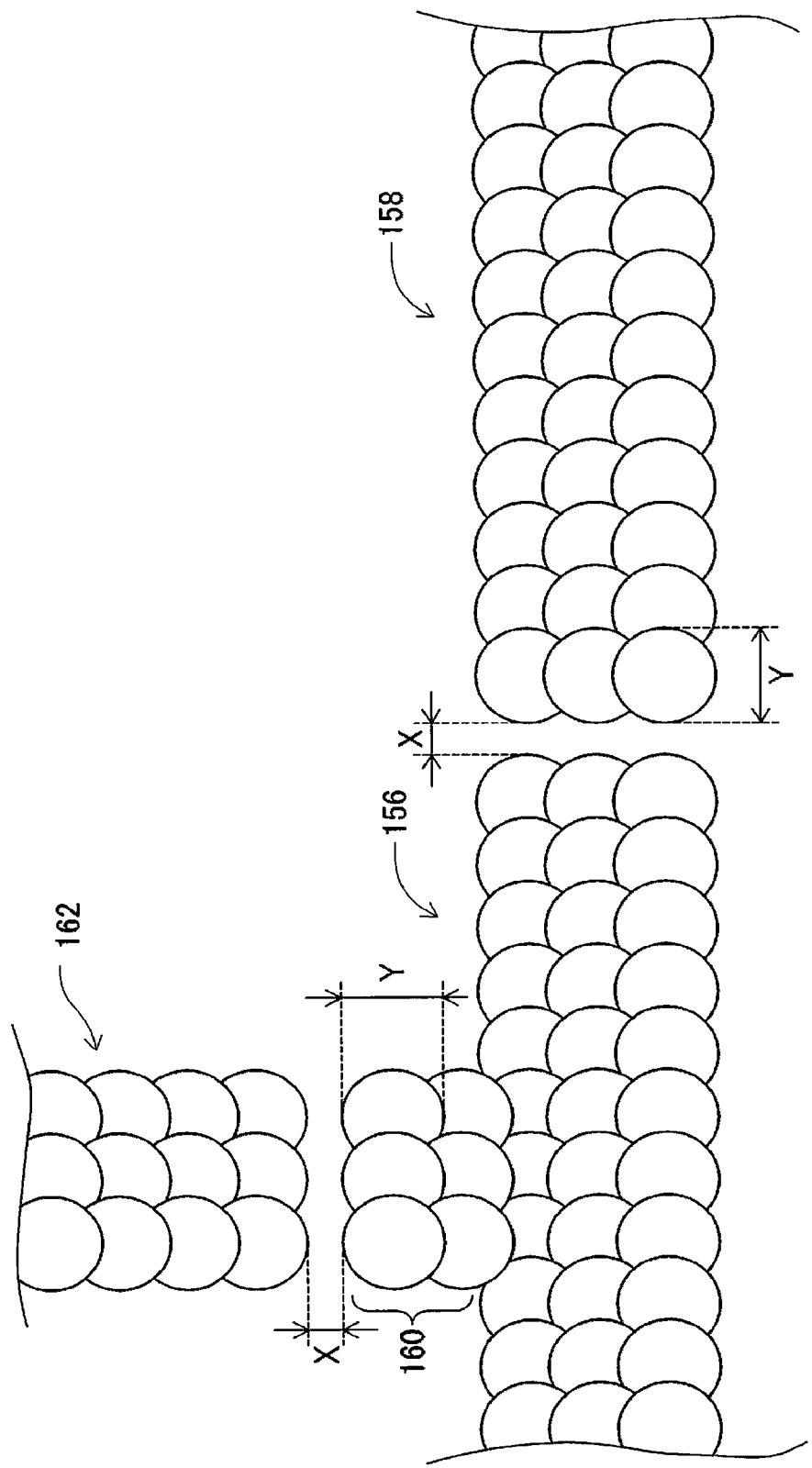
FIG. 28 is a schematic view showing the first wiring including the protruding portion, the second wiring formed with the predetermined clearance from an end portion of the first wiring, and the third wiring formed with the predetermined clearance from the protruding portion.

Then, in drying section 73, metal inks 150 are dried by irradiating metal inks 150 with infrared rays, and, further, in baking section 74, dried metal inks 152 are irradiated with a laser. By this, as shown in FIG. 28, first wiring 156, second wiring 158, and third wiring 162 are formed in a separated state with the predetermined clearances X therebetween.

Figure 29:
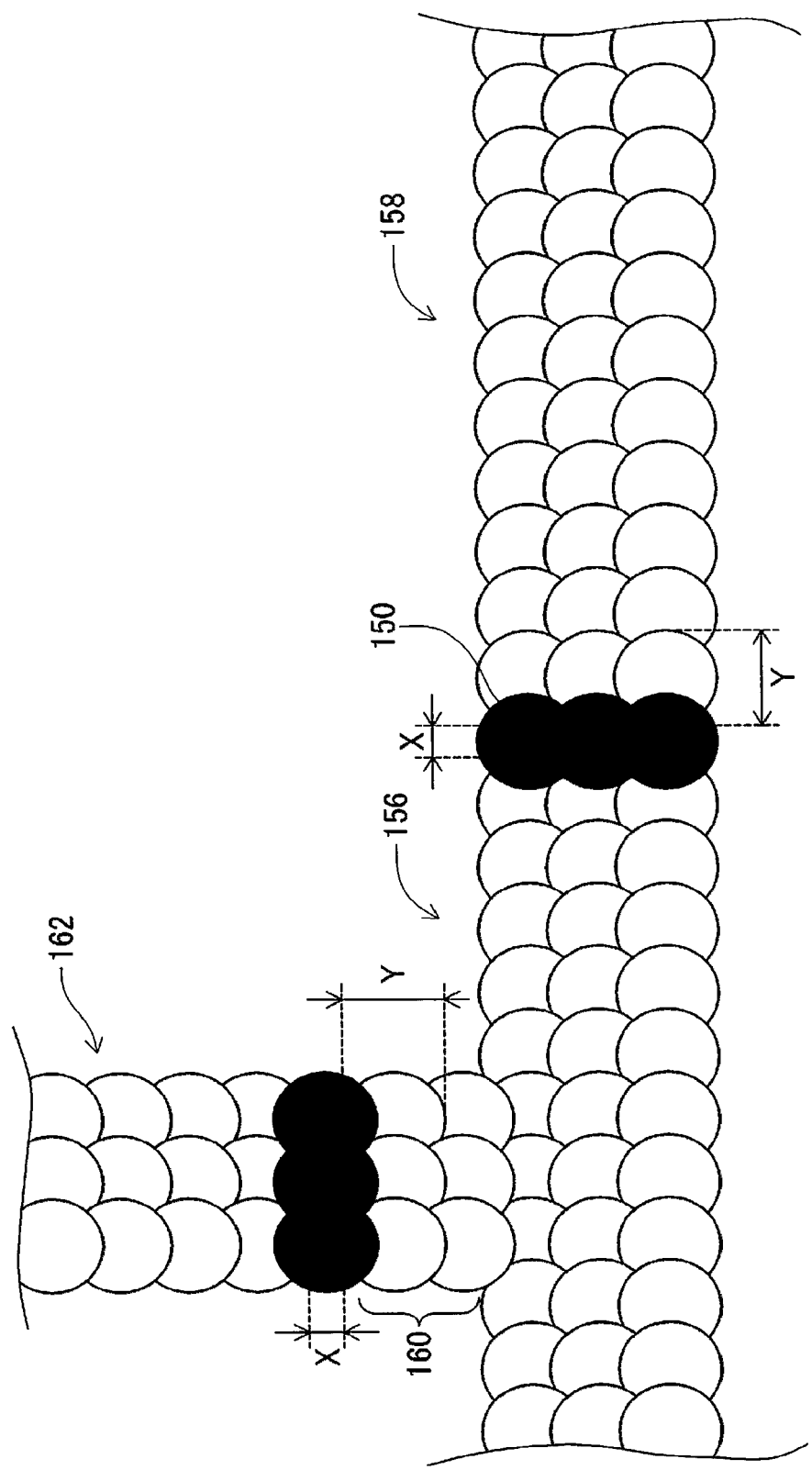
FIG. 29 is a schematic view showing the first wiring, the second wiring, and the third wiring in a state in which they have been connected to each other by ejected metal inks.

Next, in first printing section 72, as shown in FIG. 29, metal ink 150 is ejected into the clearance between first wiring 156 and second wiring 158, and metal ink 150 is ejected into the clearance between first wiring 156 and third wiring 162. Here, the droplets of metal ink 150 ejected into the clearance between first wiring 156 and second wiring 158 exist at a portion extending over first wiring 156 and second wiring 158, and the droplets of metal ink 150 ejected into the clearance between first wiring 156 and third wiring 162 exist at a portion extending over first wiring 156 and third wiring 162. By this, as described above, first wiring 156 and second wiring 158 are kept in a connected state by the droplets of metal ink 150, and first wiring 156 and third wiring 162 are kept in a connected state by the droplets of metal ink 150.

Figure 30:
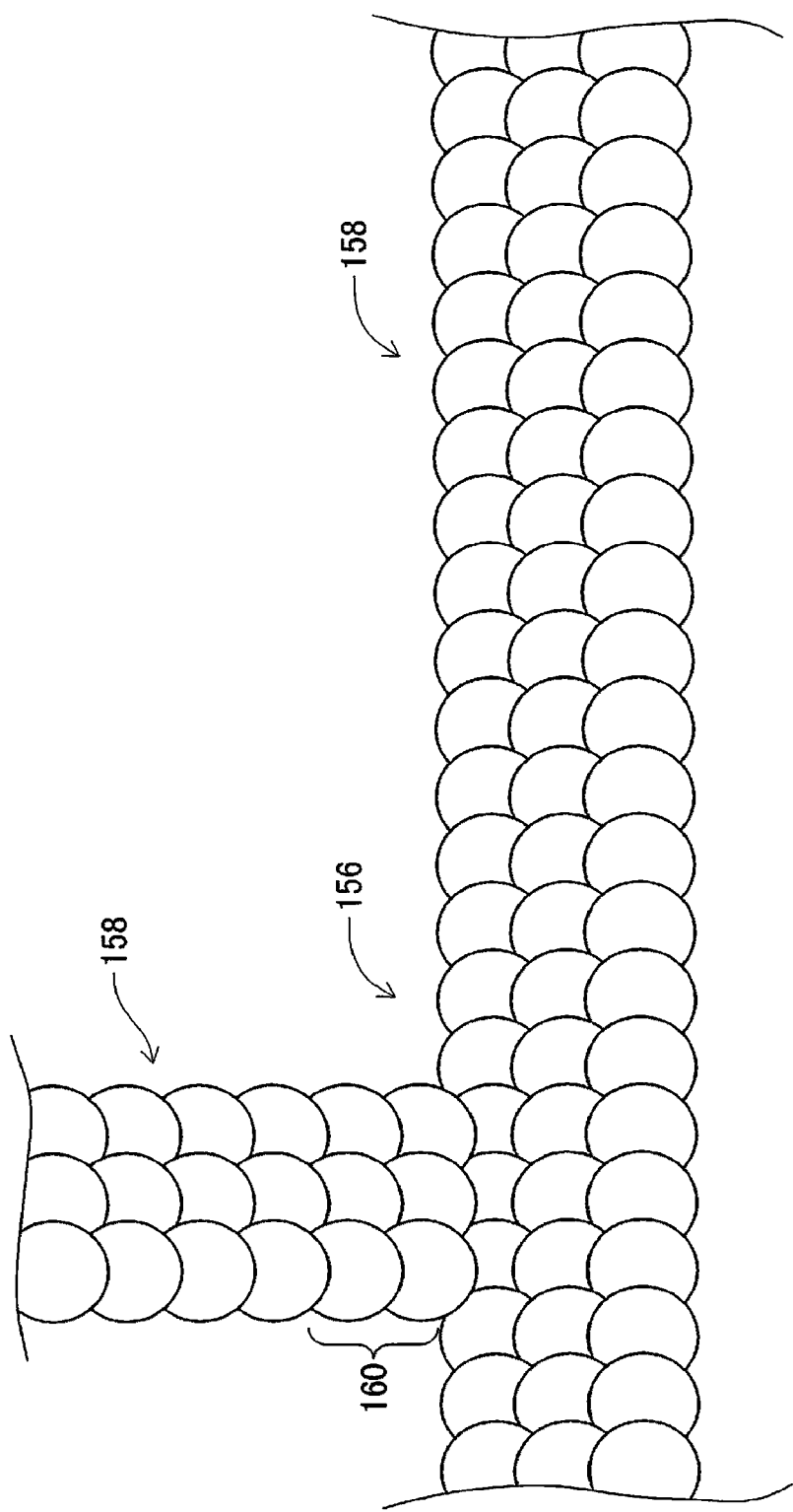
FIG. 30 is a schematic view showing the first wiring, the second wiring, and the third wiring in the connected state.

Then, in drying section 73, metal inks 150 are dried by irradiating metal inks 150 with infrared rays, and, further, in baking section 74, dried metal inks 152 are irradiated with a laser. By this, as shown in FIG. 30, first wiring 156 and second wiring 158 are formed in a linearly connected state, and first wiring 156 and third wiring 162 are formed in a connected state in a T shape. In this way, in circuit forming device 10, after forming first wiring 156, second wiring 158, and third wiring 162 together with the predetermined clearances X therebetween, metal ink 150 is ejected into each clearance together, and each wiring is formed together. That is, the step of forming wirings with clearances therebetween, the step of ejecting metal inks 150 into the clearances between the wirings, and the step of baking metal inks 150 ejected into the clearances are performed together. This makes it possible to aim at increasing throughput by efficiently performing each step.

Incidentally, in the embodiment above, inkjet head 76 is an example of an ejecting device. First wiring 156 is an example of a first wiring. Second wiring 158 is an example of a second wiring. Third wiring 162 is an example of a third wiring.

Note that the present disclosure is not limited to the embodiment above, and various modifications and improvements may be performed based on the knowledge of a person skilled in the art. For example, in the embodiment above, after drying metal ink 150 ejected by inkjet head 76 with infrared rays, metal ink 150 is baked by irradiating metal ink 150 with a laser; however, the irradiation using infrared rays may be omitted. Specifically, for the metal ink, depending upon, for example, a solvent contained in the metal ink, there exist a metal ink that cannot be properly baked unless the metal ink is dried by using, for example, infrared rays, and a metal ink that can be properly baked even if the metal ink is not dried by using, for example, infrared rays. Therefore, for a metal ink that can be properly baked even if the metal ink is not dried by using, for example, infrared rays, after ejecting the metal ink by inkjet head 76, the metal ink can be baked by irradiating the metal ink with a laser without performing an infrared-ray irradiation step.

In the embodiments above, a metal ink is baked by using a laser; however, a metal ink may be baked by using a pulse light, light of a flash lamp, or the like.

REFERENCE SIGNS LIST

76 inkjet head (ejecting device)
156 first wiring
158 second wiring
162 third wiring

The invention claimed is:

1. A circuit forming method of, by using an ejecting device configured to eject a metal-containing liquid containing metal particles, forming a circuit including a first wiring and a second wiring that is connected to the first wiring, the method comprising:
    a first ejection step of ejecting a metal-containing liquid to a planned formation position of the first wiring;
    a first baking step of forming the first wiring by baking the metal-containing liquid ejected in the first ejection step, the baking being performed so as to exclude a planned connection section of the first wiring and the second wiring;
    a second ejection step after the first baking step of ejecting a metal-containing liquid to a planned formation position of the second wiring including the planned connection section; and
    a second baking step of forming the second wiring connected to the first wiring by baking the metal-containing liquid ejected in the second ejection step,
    wherein, when the second wiring is connected to a portion of the first wiring that differs from an end portion of the first wiring, the first ejection step includes
        ejecting a metal-containing liquid to the planned formation position of the first wiring, and ejecting, as the planned connection section, a metal-containing liquid having a width that is same as a width of the second wiring so as to protrude from the planned formation position of the first wiring towards the planned formation position of the second wiring.

2. The circuit forming method according to claim 1, further comprising:
    a first drying step prior to the first baking step that dries the metal-containing liquid ejected in the first ejection step including the planned connection section.

3. The circuit forming method according to claim 2, wherein
    the first drying step is performed by infrared radiation.

4. The circuit forming method according to claim 3, wherein
    the first baking step is performed by irradiating with a laser the metal-containing liquid dried by the infrared radiation excluding the planned connection section.

5. The circuit forming method according to claim 2, further comprising:

a second drying step prior to the second baking step that dries the metal-containing liquid ejected in the second ejection step.

* * * * *